(12) United States Patent
Yanagisawa et al.

(10) Patent No.: US 12,218,237 B2
(45) Date of Patent: Feb. 4, 2025

(54) SEMICONDUCTOR DEVICE, AND METHOD FOR MANUFACTURING SEMICONDUCTOR DEVICE

(71) Applicant: SONY SEMICONDUCTOR SOLUTIONS CORPORATION, Kanagawa (JP)

(72) Inventors: Yuki Yanagisawa, Kanagawa (JP); Takashi Futatsuki, Kagoshima (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 549 days.

(21) Appl. No.: 17/276,248

(22) PCT Filed: Sep. 11, 2019

(86) PCT No.: PCT/JP2019/035702
§ 371 (c)(1),
(2) Date: Mar. 15, 2021

(87) PCT Pub. No.: WO2020/066625
PCT Pub. Date: Apr. 2, 2020

(65) Prior Publication Data
US 2022/0029017 A1     Jan. 27, 2022

(30) Foreign Application Priority Data
Sep. 28, 2018   (JP) .................... 2018-185226

(51) Int. Cl.
*H01L 29/78*  (2006.01)
*H01L 27/12*  (2006.01)
(Continued)

(52) U.S. Cl.
CPC ...... *H01L 29/7845* (2013.01); *H01L 27/1203* (2013.01); *H01L 29/0847* (2013.01);
(Continued)

(58) Field of Classification Search
CPC ................. H01L 21/823828–82385; H01L 21/823437–823456; H01L 2027/11866;
(Continued)

(56) References Cited

U.S. PATENT DOCUMENTS 5,574,293 A    11/1996  Arai et al.
5,786,615 A *  7/1998  Saito .................. H01L 29/8086
                                                            257/E29.314
(Continued)

FOREIGN PATENT DOCUMENTS

JP   H03-019212   1/1991
JP   H06-342899   12/1994
(Continued)

OTHER PUBLICATIONS

International Search Report prepared by the Japan Patent Office on Oct. 3, 2019, for International Application No. PCT/JP2019/035702.

*Primary Examiner* — Maliheh Malek
(74) *Attorney, Agent, or Firm* — Sheridan Ross PC

(57) ABSTRACT

There is provided a semiconductor device including: a semiconductor substrate; a gate insulating film provided on the semiconductor substrate; a gate electrode layer that is provided on the gate insulating film and contains impurity ions; and source or drain regions that are provided on the semiconductor substrate on both sides of the gate electrode layer and contain conductive impurities, in which a concentration of the impurity ions in the gate electrode layer is higher than concentrations of the conductive impurities in the source or drain regions.

5 Claims, 30 Drawing Sheets

(51) Int. Cl.
   *H01L 29/08* (2006.01)
   *H01L 29/40* (2006.01)
   *H01L 29/417* (2006.01)
   *H01L 29/49* (2006.01)
   *H01L 29/66* (2006.01)

(52) U.S. Cl.
   CPC ...... *H01L 29/401* (2013.01); *H01L 29/41725* (2013.01); *H01L 29/4916* (2013.01); *H01L 29/66477* (2013.01)

(58) Field of Classification Search
   CPC ... H01L 29/42312–42392; H01L 29/49–4991; H01L 29/66515; H01L 29/66545; H01L 29/66787–66818; H01L 29/78391; H01L 29/7845; H01L 27/1203; H01L 29/0847; H01L 29/401; H01L 29/41725; H01L 29/4916; H01L 29/66477; H01L 21/28035; H01L 21/28061; H01L 21/7682; H01L 29/4933; H01L 29/66772; H01L 29/7833; H01L 29/7843; H01L 29/78654
   See application file for complete search history.

(56) References Cited

U.S. PATENT DOCUMENTS

| | | | | |
|---|---|---|---|---|
| 7,060,578 | B2* | 6/2006 | Satoh | H01L 21/28052 257/E21.345 |
| 9,130,039 | B2* | 9/2015 | Yamamoto | H01L 29/7827 |
| 10,090,392 | B2* | 10/2018 | Chen | H01L 29/665 |
| 11,380,778 | B2* | 7/2022 | Cheng | H01L 29/66545 |
| 2002/0164858 | A1* | 11/2002 | Sayama | H01L 21/823857 257/E21.639 |
| 2002/0173105 | A1* | 11/2002 | Park | H01L 21/823842 257/269 |
| 2002/0179908 | A1 | 12/2002 | Arao | |
| 2004/0041177 | A1* | 3/2004 | Satoh | H01L 29/6653 257/E21.345 |
| 2009/0224321 | A1* | 9/2009 | Tsuchiya | H01L 21/823807 438/154 |
| 2011/0175205 | A1* | 7/2011 | Morii | H01L 27/1203 438/421 |
| 2013/0056832 | A1* | 3/2013 | Sato | H01L 21/28518 257/369 |
| 2013/0273706 | A1* | 10/2013 | Hung | H01L 29/7847 438/303 |
| 2014/0042529 | A1* | 2/2014 | Yamamoto | H01L 29/66772 438/270 |
| 2015/0084064 | A1* | 3/2015 | Yamamoto | H01L 29/78627 257/77 |
| 2015/0200270 | A1* | 7/2015 | Flachowsky | H01L 27/092 257/338 |
| 2015/0325673 | A1* | 11/2015 | Yamamoto | H01L 29/66666 438/300 |
| 2015/0364490 | A1* | 12/2015 | Oda | H01L 21/823412 438/154 |
| 2016/0104795 | A1* | 4/2016 | Yamashita | H01L 29/7813 257/330 |
| 2017/0373145 | A1* | 12/2017 | Shinkawata | H01L 21/76283 |
| 2019/0057971 | A1* | 2/2019 | Tsukamoto | H01L 21/02189 |
| 2019/0237485 | A1* | 8/2019 | Chu | H01L 29/6659 |
| 2020/0091293 | A1* | 3/2020 | Komatsu | H01L 29/7835 |

FOREIGN PATENT DOCUMENTS

| | | |
|---|---|---|
| JP | H10-247734 | 9/1998 |
| JP | 2002-329868 | 11/2002 |
| JP | 2018-088553 | 6/2018 |

* cited by examiner

SEMICONDUCTOR DEVICE, AND METHOD FOR MANUFACTURING SEMICONDUCTOR DEVICE

CROSS REFERENCE TO RELATED APPLICATIONS

This application is a national stage application under 35 U.S.C. 371 and claims the benefit of PCT Application No. PCT/JP2019/035702 having an international filing date of 11 Sep. 2019, which designated the United States, which PCT application claimed the benefit of Japanese Patent Application No. 2018-185226, filed 28 Sep. 2018, the entire disclosures of each of which are incorporated herein by reference.

TECHNICAL FIELD

The present disclosure relates to a semiconductor device and a method for manufacturing a semiconductor device.

BACKGROUND ART

In recent years, in order to further improve the performance of semiconductor devices provided with a field effect transistor, many attempts for reducing resistance when the field effect transistor is turned on (hereinafter, also referred to as on-resistance) have been considered.

For example, it is known for field effect transistors that by applying stress to a channel in which carriers move, an effective mass of the carriers can be reduced and carrier mobility can be improved. As an example of such a method of applying stress to a channel, for example, as described in PTL 1 below, it is known that a stress liner film having film stress can be formed to cover a field effect transistor.

CITATION LIST

Patent Literature

[PTL 1]
JP 2011-199112A

SUMMARY

Technical Problem

However, as semiconductor devices become smaller and have increasingly higher performance, it is required to further reduce the on-resistance of field effect transistors. Therefore, the present disclosure proposes a new and improved semiconductor device and a method for manufacturing a semiconductor device, which can further reduce the on-resistance.

Solution to Problem

According to the present disclosure, there is a semiconductor device including: a semiconductor substrate; a gate insulating film provided on the semiconductor substrate; a gate electrode layer that is provided on the gate insulating film and contains impurity ions; and source or drain regions that are provided on the semiconductor substrate on both sides of the gate electrode layer and contain conductive impurities, in which a concentration of the impurity ions in the gate electrode layer is higher than concentrations of the conductive impurities in the source or drain regions.

According to the present disclosure, there is a semiconductor device including: a semiconductor substrate; a gate insulating film provided on the semiconductor substrate; a gate electrode layer that is provided on the gate insulating film and contains impurity ions; source or drain regions that are provided on the semiconductor substrate on both sides of the gate electrode layer and contain conductive impurities; a first insulating layer provided on the semiconductor substrate; contacts that penetrate the first insulating layer and are provided respectively on the source or drain regions; a second insulating layer provided on the first insulating layer; wiring layers provided on the second insulating layer above the respective contacts; and low dielectric constant regions that are provided in the first insulating layer and the second insulating layer at respective locations between the contacts and the wiring layers and have dielectric constants lower than those of the first insulating layer and the second insulating layer, in which the first insulating layer and the second insulating layer on surface sides provided with the low dielectric constant regions contain impurity ions.

Also, according to the present disclosure, there is provided a method for manufacturing a semiconductor device including: forming a gate insulating film uniformly on a semiconductor substrate; forming a gate electrode layer uniformly on the gate insulating film; introducing impurity ions into the gate electrode layer; patterning the gate insulating film and the gate electrode layer; and introducing conductive impurities into the semiconductor substrate on both sides of the gate insulating film and the gate electrode layer to form source or drain regions in the semiconductor substrate, in which a concentration of the impurity ions introduced into the gate electrode layer is higher than concentrations of the conductive impurities introduced into the source or drain regions.

Also, according to the present disclosure, there is provided a method for manufacturing a semiconductor device including: forming a gate insulating film uniformly on a semiconductor substrate; forming a gate electrode layer uniformly on the gate insulating film; patterning the gate insulating film and the gate electrode layer; introducing conductive impurities into the semiconductor substrate on both sides of the gate insulating film and the gate electrode layer to form source or drain regions in the semiconductor substrate; forming a first insulating layer on the semiconductor substrate; forming contacts penetrating the first insulating layer respectively on the source or drain regions; forming wiring layers on the respective contacts and forming a second insulating layer on the first insulating layer; forming openings for exposing the gate electrode layer in the first insulating layer and the second insulating layer between the contacts and the wiring layers; introducing impurity ions into the first insulating layer, the second insulating layer, and the gate electrode layer that are adjacent to the openings; and forming a third insulating layer that seals the openings on the second insulating layer.

According to the present disclosure, since large stress can be applied to the gate electrode layer, large stress can also be applied to a channel region directly below the gate electrode layer. Thus, in the semiconductor device according to one embodiment of the present disclosure, carrier mobility in the channel region can be further improved.

Advantageous Effects of Invention

As described above, according to the present disclosure, it is possible to further reduce on-resistance of a field effect transistor.

Also, the above effects are not necessarily intended as limiting, and in addition to or in place of the above effects, any of the effects presented herein or any other effects that can be ascertained from the present specification may be achieved.

DESCRIPTION OF EMBODIMENTS

Figure 1A:
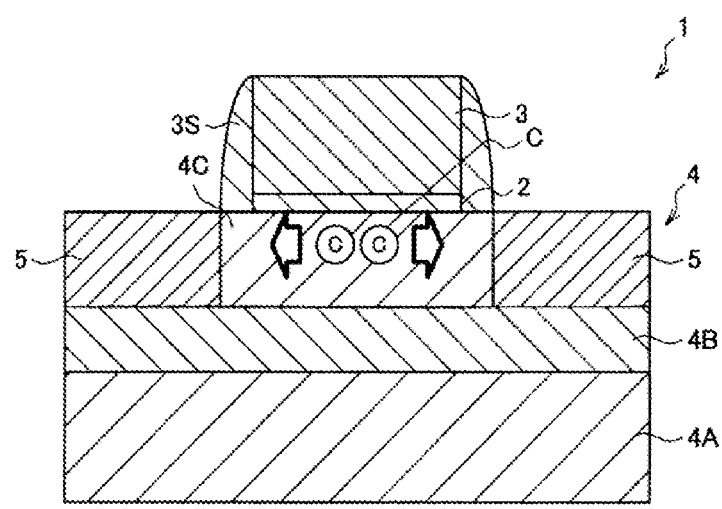
FIG. 1A is an explanatory diagram for illustrating an influence on carriers in a case in which stress is applied to a channel.

Preferred embodiments of the present disclosure will be described in detail below with reference to the accompanying figures. In addition, in the present specification and the figures, components having substantially the same functional configuration will be denoted by the same reference numerals, and thus repeated descriptions thereof will be omitted.

In each figure referred to in the following description, sizes of some of constituent members may be exaggerated for convenience of explanation. Therefore, relative sizes of the constituent members shown in each figure do not necessarily accurately represent a relationship in magnitude between actual constituent members. Further, in the following description, a laminating direction of a substrate and layers is expressed as a vertical direction, and a direction in which the layers are laminated on the substrate or the like is expressed as an upward direction.

Also, the description will be given in the following order.
1. Technical background relating to the present disclosure
2. First Embodiment
2.1. Configuration
2.2. Effects verification 3. Second Embodiment
3.1. Configuration
3.2. Method for manufacturing
4. Application examples

1. TECHNICAL BACKGROUND RELATING TO THE PRESENT DISCLOSURE

Figure 1B:
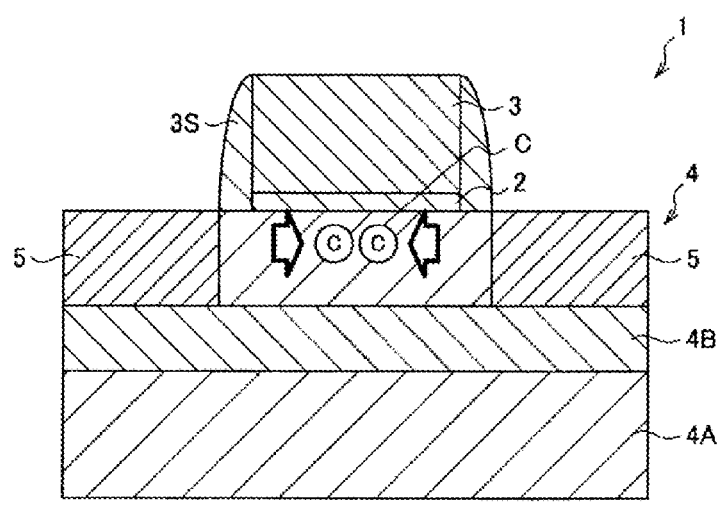
FIG. 1B is an explanatory diagram for illustrating an influence on carriers in a case in which stress is applied to the channel.

First, the technical background of the present disclosure will be described with reference to FIGS. 1A to 3. FIGS. 1A and 1B are explanatory diagrams for explaining an influence on carriers in a case in which stress is applied to a channel.

In recent years, in order to improve characteristics of a semiconductor device, it has been required to reduce resistance (also referred to as on-resistance) when a field effect transistor mounted on the semiconductor device is turned on. As a method of reducing on-resistance of a field effect transistor, for example, as shown in FIGS. 1A and 1B, attempts have been made to control carrier mobility by applying stress to a channel of the field effect transistor.

For example, FIGS. 1A and 1B show a field effect transistor 1 having a general structure. Specifically, the field effect transistor 1 is configured by laminating a gate insulating film 2 and a gate electrode 3 on a first conductivity type semiconductor layer 4C and forming source or drain regions 5 in which a second conductivity type impurity is introduced at a high concentration in the semiconductor layer 4C on both sides of the gate insulating film 2 and the gate electrode 3. In addition, a sidewall insulating film 3S is provided on side surfaces of the gate insulating film 2 and the gate electrode 3.

Further, the field effect transistor 1 is formed on, for example, a semiconductor substrate 4 on which the semiconductor layer 4C formed of silicon (Si) is provided on a support substrate 4A formed of silicon (Si) with an insulating film 4B formed of silicon dioxide ($SiO_2$) therebetween. That is, the semiconductor substrate 4 is a silicon substrate having the insulating film 4B formed of silicon dioxide sandwiched therein and is also referred to as a silicon on insulator (SOI) substrate. Also, the insulating film 4B is also referred to as a buried oxide (BOX) layer. The insulating film 4B electrically insulates the semiconductor layer 4C from the support substrate 4A, and thus a parasitic capacitance between the semiconductor layer 4C and the support substrate 4A can be reduced, and a leakage current from a channel formed in the semiconductor layer 4C toward the support substrate 4A can be reduced.

In the field effect transistor 1, a mobility of carriers C can be controlled by applying stress to a channel region formed between the source or drain regions 5. Specifically, in an N-type transistor in which the semiconductor layer 4C is p-type and the source or drain regions 5 are n-type, by applying tensile stress in an in-plane direction of the channel region, an effective mass of electrons as the carriers C can be reduced and a mobility of the electrons can be improved. On the other hand, in a P-type transistor in which the semiconductor layer 4C is n-type and the source or drain regions 5 are p-type, by applying compressive stress in the in-plane direction of the channel region, an effective mass of holes as the carriers C can be reduced and a mobility of the holes can be improved.

Figure 2:
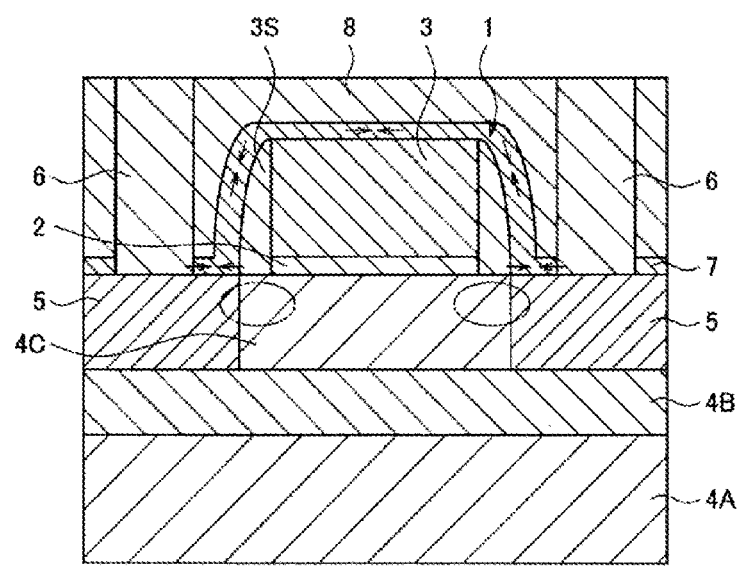
FIG. 2 is an explanatory diagram illustrating stress application resulting from a stress liner film.

As a method of applying stress to the channel region, for example, as shown in FIG. 2, it is conceivable to use a stress liner film 7 provided as an etching stopper. FIG. 2 is an explanatory diagram illustrating stress application by the stress liner film.

As shown in FIG. 2, the stress liner film 7 is uniformly provided on the semiconductor layer 4C to cover the field effect transistor 1. When contacts 6 electrically connected to the source or drain regions 5 are formed, the stress liner film 7 is provided to control etching of an opening that penetrates a flattening film 8. Specifically, the stress liner film 7 is formed of an insulating material having an etching rate different from that of the flattening film 8 and has a function of stopping progress of the etching when the flattening film 8 is etched.

Here, since the stress liner film 7 is formed along the gate electrode 3 provided to protrude from the semiconductor layer 4C, it has film stress due to stress concentration generated by deformation. As a result, the stress liner film 7 can apply tensile stress to both end portions of the gate electrode 3 and the semiconductor layer 4C in the vicinity immediately below the sidewall insulating film 3S.

However, the application of the stress of the stress liner film 7 to the semiconductor layer 4C is structurally limited to areas of the semiconductor layer 4C at both end portions of the gate electrode 3 and immediately below the sidewall insulating film 3S. For that reason, the stress applied from the stress liner film 7 to the semiconductor layer 4C decreases from both end portions of the gate electrode 3 toward a center thereof and does not easily propagate to the entire channel region. For that reason, when viewing the entire channel region, an amount of the stress applied by the stress liner film 7 cannot be readily increased, and it is difficult to significantly improve the mobility of the carriers C. In particular, in the field effect transistor 1 having a long distance (that is, a gate length) between the source or drain regions 5, the stress applied to the semiconductor layers 4C at both end portions of the gate electrode 3 becomes more unlikely to propagate toward the center of the gate electrode 3. For that reason, the effect of improving the carrier mobility by applying stress from the stress liner film 7 decreases.

Figure 3:
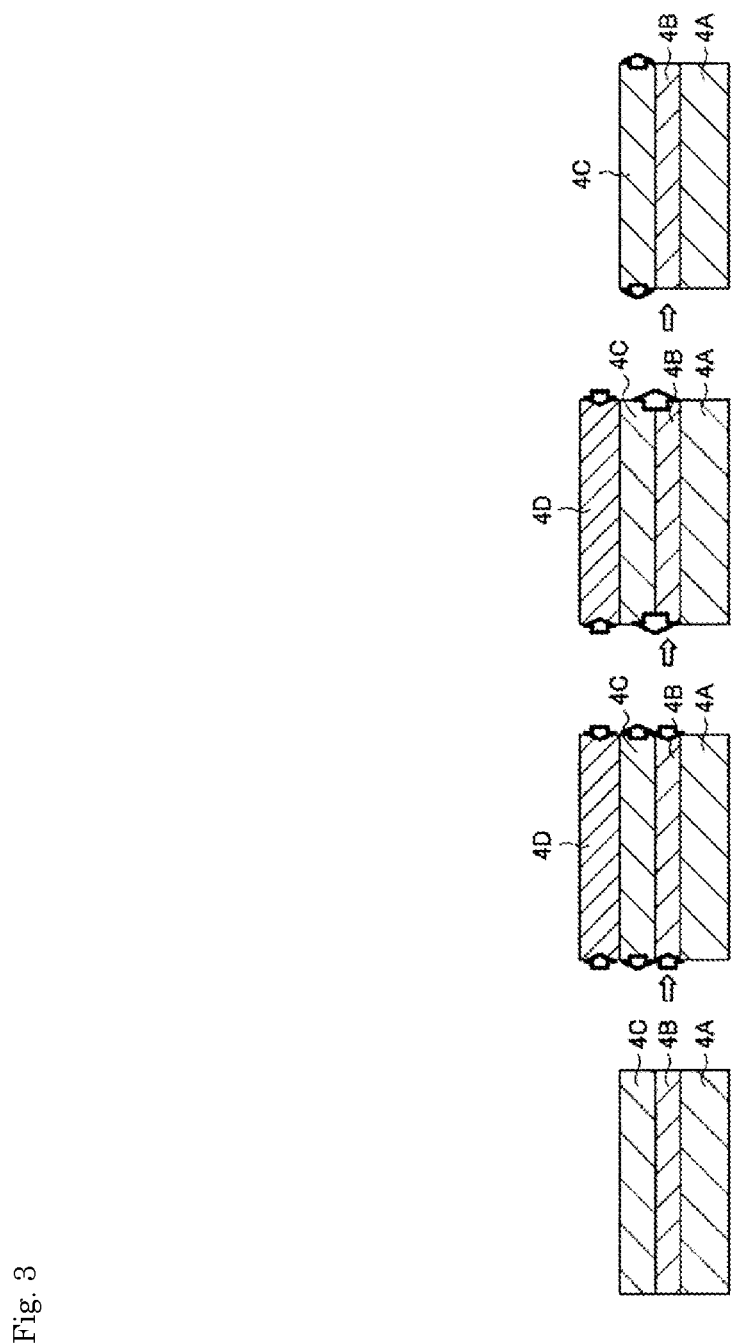
FIG. 3 is an explanatory diagram illustrating a method of stress application using an SOI substrate.

As another method of applying stress to the channel region besides the method using the stress liner film 7, for example, as shown in FIG. 3, a method of applying stress to the semiconductor layer 4C using an SOI substrate without depending on a structure of the field effect transistor has been considered. FIG. 3 is an explanatory diagram illustrating a method of applying stress using an SOI substrate.

As shown in FIG. 3, first, a stress layer 4D having film stress in a compression direction is laminated on the semiconductor layer 4C of the SOI substrate on which the support substrate 4A, the insulating film 4B, and the semiconductor layer 4C are laminated. For example, the support substrate 4A and the semiconductor layer 4C are formed of silicon (Si), the insulating film 4B is formed of silicon dioxide ($SiO_2$), and the stress layer 4D is formed of silicon nitride (SiN). As a result, tensile stress that is reverse to that of the laminated stress layer 4D is applied to the semiconductor layer 4C, and compressive stress that is reverse to that of the semiconductor layer 4C is applied to the insulating film 4B.

Here, the SOI substrate on which the stress layer 4D is laminated is annealed at a high temperature (for example, about 1200° C.) to cause a creep phenomenon in the insulating film 4B, thereby deforming the insulating film 4B. As a result, since tensile stress is applied to the semiconductor layer 4C from the deformed insulating film 4B, application of tensile stress to the semiconductor layer 4C can be maintained even after the stress layer 4D is removed.

Specifically, the creep phenomenon represents a phenomenon in which a material is deformed by being exposed to a high temperature for a long time even in a case in which a load smaller than a yield load is applied. For example, in a case in which $SiO_2$ is exposed to a high temperature exceeding 50% of its melting point of 1800° C., a pore concentration, a mobility of atoms, a mobility of dislocations, a mobility of grain boundaries, and susceptibility to slippage thereof change. For that reason, in a case in which stress is applied to the semiconductor layer 4C and the insulating film 4B by the stress layer 4D and then the creep phenomenon is caused in the insulating film 4B, rigidity of the insulating film 4B is reduced, and the insulating film 4B is pulled by the semiconductor layer 4C to be deformed. As a result, even if the stress layer 4D is removed after returning to room temperature, the insulating film 4B remains deformed due to the creep phenomenon, and thus tensile stress can be applied from the insulating film 4B to the semiconductor layer 4C.

According to this method, it is considered that a relatively uniform stress can be applied to the semiconductor layer 4C. However, since the insulating film 4B is constrained by the support substrate 4A having higher rigidity, it is unlikely that the insulating film 4B will be significantly deformed due to the creep phenomenon. For that reason, in this method, there is a limit to a magnitude of tensile stress that can be applied to the semiconductor layer 4C. In addition, during annealing at a high temperature, film shrinkage of the stress layer 4D occurs, and thus compressive stress applied to the stress layer 4D may change to tensile stress, or the stress layer 4D may peel off. In such a case, it becomes difficult to apply a desired stress to the semiconductor layer 4C.

Therefore, since the amount of stress that can be applied to the channel region of the semiconductor layer 4C is limited in any of the above methods, it has been difficult to significantly reduce the on-resistance of the field effect transistor 1.

A technique according to the present disclosure has been conceived in view of the above circumstances. In the technique according to the present disclosure, it is possible to further reduce the on-resistance of a field effect transistor by applying a uniform and larger stress to a channel region of the field effect transistor. Hereinafter, the technique according to the present disclosure will be described separately for the first embodiment and the second embodiment.

2. FIRST EMBODIMENT (2.1. Configuration)

Figure 4:
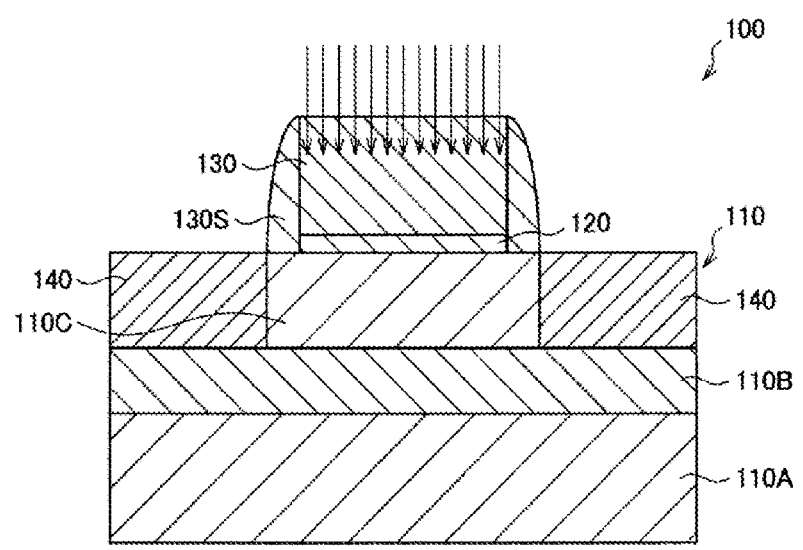
FIG. 4 is a vertical cross-sectional view illustrating a configuration of a semiconductor device according to a first embodiment of the present disclosure.

A semiconductor device according to the first embodiment of the present disclosure will be described with reference to FIG. 4. FIG. 4 is a vertical cross-sectional view illustrating a configuration of a semiconductor device 100 according to the first embodiment.

As shown in FIG. 4, the semiconductor device 100 includes a semiconductor substrate 110 in which a support substrate 110A, an insulating film 110B, and a semiconductor layer 110C are laminated, a gate insulating film 120 provided on the semiconductor layer 110C, a gate electrode layer 130 provided on the gate insulating film 120, a sidewall insulating film 130S formed on side surfaces of the gate insulating film 120 and the gate electrode layer 130, and source or drain regions 140 formed in the semiconductor layer 110C. The semiconductor device 100 according to the present embodiment is, for example, an N-type field effect transistor.

The semiconductor substrate 110 is a substrate on which the semiconductor device 100 is formed. The semiconductor substrate 110 may be, for example, a substrate in which the support substrate 110A, the insulating film 110B, and the semiconductor layer 110C are laminated. By using the semiconductor substrate 110 in which such a plurality of layers are laminated, the semiconductor device 100 can reduce a volume of the semiconductor layer 110C in which a channel is formed, and thus a larger stress can be locally generated by an external force. According to this, the semiconductor substrate 110 in which the plurality of layers are laminated can further reduce the on-resistance of a field effect transistor in which a channel is formed in the semiconductor layer 110C.

The support substrate 110A is a main support body of the semiconductor substrate 110. For example, the support substrate 110A may be a silicon (Si) substrate, may be a substrate formed of an elemental semiconductor or a compound semiconductor other than silicon, or may be a quartz substrate, a sapphire substrate, or the like.

The insulating film 110B separates the support substrate 110A from the semiconductor layer 110C to reduce a parasitic capacitance and a leakage current of the semiconductor device 100. For example, the insulating film 110B may be formed of silicon dioxide ($SiO_2$), silicon nitride (SiN), or an insulating inorganic oxynitride such as silicon oxynitride (SiON).

The semiconductor layer 110C is a layer on which a channel region, a source region, and a drain region of the field effect transistor are formed. Specifically, the semiconductor layer 110C may be, for example, a silicon layer into which a p-type impurity such as boron (B) or aluminum (Al) has been introduced.

That is, the semiconductor substrate 110 may be a silicon on insulator (SOI) substrate in which the support substrate 110A formed of silicon (Si), the insulating film 110B formed of silicon dioxide ($SiO_2$), and the semiconductor layer 110C formed of silicon (Si) are laminated. Such an SOI substrate can be formed by sequentially laminating the insulating film 110B and the semiconductor layer 110C on the support substrate 110A, or by converting a predetermined internal region of the semiconductor substrate 110 into an oxide through thermal oxidation to generate the insulating film 110B embedded therein.

SOI substrates can be divided into so-called fully depleted silicon on insulator (FDSOI) substrates and partially depleted silicon on insulator (PDSOI) substrates depending on a depth at which the insulating film 110B is provided (that is, a thickness of the semiconductor layer 110C), and the semiconductor substrate 110 may be either an FDSOI substrate or a PDSOI substrate. In a case in which the semiconductor substrate 110 is an FDSOI substrate, a volume of the semiconductor layer 110C in which the channel is formed further decreases, and thus the stress generated in the semiconductor layer 110C can be further increased. According to this, in the semiconductor substrate 110, the on-resistance of a field effect transistor in which a channel is formed in the semiconductor layer 110C can be reduced.

Also, needless to say, the semiconductor substrate 110 may be a substrate formed of a single material instead of the above-mentioned substrate in which a plurality of layers are laminated. For example, the semiconductor substrate 110 may be a silicon (Si) substrate or may be a substrate formed of a compound semiconductor such as germanium (Ge), gallium arsenide (GaAs), gallium nitride (GaN), or silicon carbide (SiC).

The source or drain regions 140 contain conductive impurities different from those of the semiconductor layer 4C and is provided in the semiconductor layer 110C on both sides of the gate insulating film 120 and the gate electrode layer 130. The source or drain regions 140 each function as a source terminal or a drain terminal of the field effect transistor. For example, the source or drain regions 140 may be formed by introducing n-type impurities such as phosphorus (P) or arsenic (As) into the semiconductor layer 110C on both sides of the gate insulating film 120 and the gate electrode layer 130. Any of the source or drain regions 140 formed on both sides of the gate insulating film 120 and the gate electrode layer 130 may function as a source region and any of them may function as a drain region. These are arbitrarily replaceable with each other.

Further, a lightly-doped drain (LDD) region which has the same conductivity type as the source or drain regions 140 and has a lower concentration of conductive impurities than the source or drain regions 140 may be formed in the semiconductor layer 110C between the source or drain regions 140 and a region in which the gate insulating film 120 and the gate electrode layer 130 are provided.

The gate insulating film 120 is provided on the semiconductor layer 110C. The gate insulating film 120 may be formed of, for example, silicon dioxide ($SiO_2$), silicon nitride (SiN), or an insulating inorganic oxynitride such as silicon oxynitride (SiON).

The sidewall insulating film 130S is made of an insulating material and is provided as a side wall on the side surfaces of the gate insulating film 120 and the gate electrode layer 130. Specifically, the sidewall insulating film 130S can be formed by uniformly forming an insulating film in a region including the gate electrode layer 130 and then vertically anisotropically etching the insulating film. For example, the sidewall insulating film 130S may be formed of a single layer or a plurality of layers with silicon dioxide ($SiO_2$), silicon nitride (SiN) or an insulating inorganic oxynitride such as silicon oxynitride (SiON).

The sidewall insulating film 130S controls a positional relationship between the gate electrode layer 130 and the source or drain regions 140 in a self-aligned manner by shielding conductive impurities introduced into the semiconductor layer 110C. For example, by forming the sidewall insulating film 130S, the conductive impurities can be introduced stepwise into the semiconductor layer 110C. According to this, it is possible to form the LDD region in a self-aligned manner between the source or drain regions 140 and the region in which the gate insulating film 120 and the gate electrode layer 130 are provided.

The gate electrode layer 130 contains impurity ions and is provided on the gate insulating film 120. The gate electrode layer 130 functions as a gate terminal of the field effect transistor. The gate electrode layer 130 may be provided to have, for example, a film thickness of 80 nm to 150 nm.

In the semiconductor device 100 according to the present embodiment, compressive stress is applied to the gate electrode layer 130 by introducing impurity ions at a concentration higher than a concentration of the conductive impurities in the source or drain regions 140. As a result, since the gate electrode layer 130 can apply tensile stress to the semiconductor layer 110C in which the channel region is formed immediately below the gate electrode layer 130, a mobility of electrons in the channel region can be improved. Therefore, in the semiconductor device 100 according to the present embodiment, the on-resistance of the field effect transistor can be reduced.

Specifically, the gate electrode layer 130 is formed of polysilicon and contains phosphorus (P) ions having a concentration of $6.0 \times 10^{20}/cm^3$ or more, so that compressive stress can be applied thereto. It is thought that this is because a large number of phosphorus ions having a small atomic radius enter between silicon (Si) atoms of the gate electrode layer 130, whereby a force that spreads intervals between the silicon (Si) atoms of the gate electrode layer 130 is exerted. Also, an upper limit of a phosphorus (P) ion concentration in the gate electrode layer 130 is not particularly limited, but may be $1.0 \times 10^{23}/cm^3$ from the viewpoint of cost effectiveness, for example.

On the other hand, a concentration of the conductive impurities contained in the source or drain regions 140 is less than $6.0 \times 10^{20}/cm^3$, for example, about $2.5 \times 10^{20}/cm^3$. Therefore, in a case in which the concentration of the phosphorus ions contained in the gate electrode layer 130 is similar to the concentration of the conductive impurities contained in the source or drain regions 140, an amount of the phosphorus ions that enter between the silicon (Si) atoms is small, and thus the above-mentioned compressive stress is not applied to the gate electrode layer 130.

Also, the gate electrode layer 130 may be formed in a multilayer structure in which a plurality of types of layers are laminated. In such a case, at least one layer of the gate electrode layer 130 may be formed of a polysilicon layer containing phosphorus ions having a concentration of $6.0 \times 10^{20}/cm^3$ or more, as described above. The polysilicon layer containing the phosphorus ions having a concentration of $6.0 \times 10^{20}/cm^3$ or more is provided at a position closer to the semiconductor layer 110C, and thus tensile stress can be effectively applied by the semiconductor layer 110C. Other layers constituting the gate electrode layer 130 may be formed of a conductive material such as a metal such as titanium (Ti), molybdenum (Mo), tantalum (Ta), tungsten (W), niobium (Nb), nickel (Ni), zirconium (Zr), gold (Au), silver (Ag), aluminum (Al) or copper (Cu), an alloy thereof, or a metal compound thereof.

(2.2. Effects Verification)

Here, results of verifying effects of the semiconductor device 100 according to the present embodiment will be described with reference to FIGS. 5 to 14C.

Figure 5:
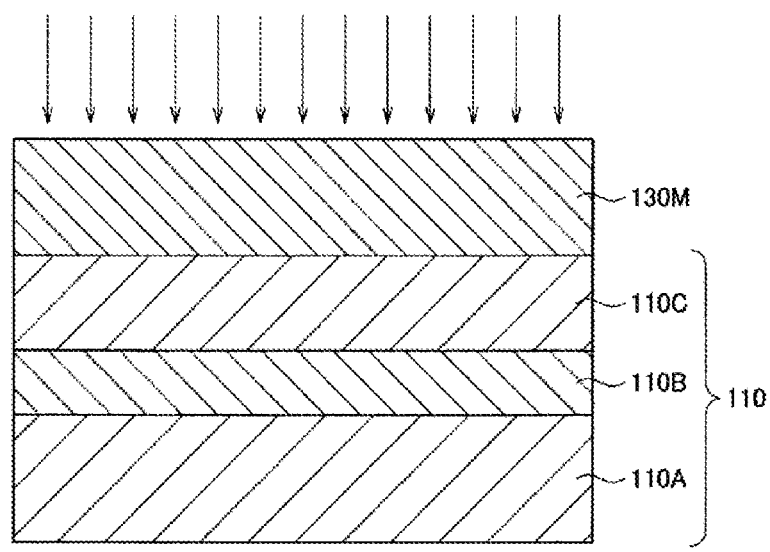
FIG. 5 is a vertical cross-sectional view illustrating a configuration of a sample in which generation of film stress has been verified.
Figure 6A:
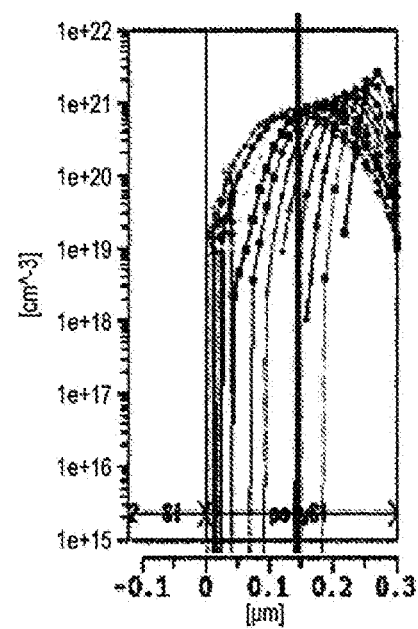
FIG. 6A is a graph showing simulation results of a phosphorus ion concentration distribution when phosphorus ions are introduced into polysilicon having a film thickness of 300 nm.
Figure 6B:
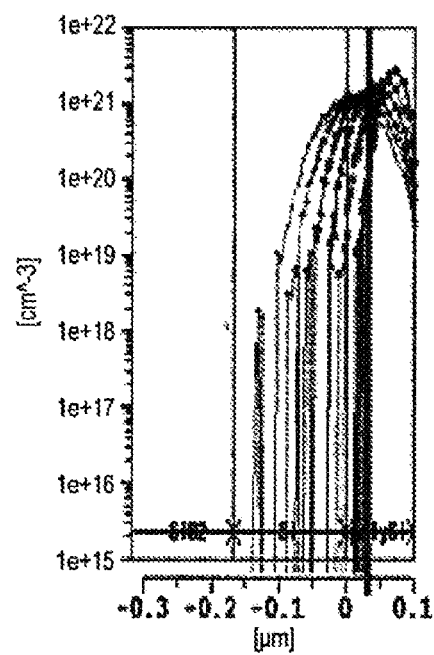
FIG. 6B is a graph showing simulation results of a phosphorus ion concentration distribution when phosphorus ions are introduced into polysilicon having a film thickness of 100 nm.

First, with reference to FIGS. 5 to 6B, generation of film stress due to introduction of phosphorus ions into the gate electrode layer 130 formed of polysilicon will be described. FIG. 5 is a vertical cross-sectional view illustrating the configuration of the sample in which the generation of film stress is verified. FIG. 6A is a graph showing simulation results of a phosphorus ion concentration distribution when phosphorus ions are introduced into polysilicon having a film thickness of 300 nm. FIG. 6B is a graph showing simulation results of a phosphorus ion concentration distribution when phosphorus ions are introduced into polysilicon having a film thickness of 100 nm.

As shown in FIG. 5, the semiconductor substrate 110 (that is, an SOI substrate) in which the insulating film 110B formed of silicon dioxide and the semiconductor layer 110C formed of silicon are laminated was prepared on the support substrate 110A formed of silicon. Also, a film thickness of the insulating film 110B is about 400 nm, and a film thickness of the semiconductor layer 110C is about 150 nm.

By using a low pressure chemical vapor deposition (LP-CVD) method for such a semiconductor substrate 110, a film is formed under conditions of 400° C. to 600° C., 100 Pa to 300 Pa, and 40 minutes to 70 minutes, and thus a polysilicon layer 130M having a thickness of 80 nm to 300 nm was deposited. In addition, in a case in which the polysilicon layer 130M has tensile stress, high temperature annealing at 800° C. or higher was performed to relax film stress generated during deposition, thereby producing a sample for verification.

Here, for the sample for verification, phosphorus ions were introduced into the polysilicon layer 130M under different conditions. For example, the phosphorus ions were introduced into the polysilicon layer 130M with an energy of 10 keV to 30 keV and a dose amount of $8\times10^{15}/cm^2$ to $3\times10^{16}/cm^2$.

FIG. 6A shows simulation results of a phosphorus ion concentration distribution in a case in which phosphorus ions were introduced into the polysilicon layer 130M having a film thickness of 300 nm under different conditions. In the simulation results shown in FIG. 6A, the polysilicon layer 130M (polySi), the semiconductor layer 110C (Si), and the insulating film 110B (SiO2) are shown from the right in the case of facing FIG. 6A.

Further, from the conditions shown in FIG. 6A, a condition (50 keV and $1.0\times10^{16}/cm^2$) in which phosphorus ions are appropriately introduced to a central portion of the polysilicon layer 130M in a film thickness direction thereof was selected, and the film stress applied to the semiconductor substrate 110 was measured from an amount of warpage of the semiconductor substrate 110. The results are shown in Table 1 below. In addition, Rxaxis [m] shown in Table 1 represents the amount of warpage of the semiconductor substrate 110, σ [Pa] represents the film stress of the polysilicon layer 130M, and Δσ [MPa] represents an amount of change in the film stress of the polysilicon layer 130M.

TABLE 1

|  |  | Rxaxis [m] | σ [Pa] | Δσ [MPa] |
|---|---|---|---|---|
| Polysilicon layer deposition | before | −118.017 | −3.17E+09 | 1000 |
|  | after | −172.541 | −2.17E+09 |  |
| Annealing | before | −116.729 | −3.20E+09 | 240 |
|  | after | −126.308 | −2.96E+09 |  |
| Phosphorus ion introduction | before | −113.065 | −3.31E+09 | −2680 |
|  | after | −62.457 | −5.99E+09 |  |

As shown in Table 1, it can be seen that a tensile stress of 1,000 MPa is applied to the semiconductor substrate 110 due to the deposition of the polysilicon layer 130M. Further, it can be seen that the tensile stress applied to the semiconductor substrate 110 is relaxed up to 200 MPa by performing high temperature annealing at 800° C. or higher. On the other hand, it can be seen that by introducing the phosphorus ions into the polysilicon layer 130M, a very large compressive stress of about 2,700 MPa is applied to the semiconductor substrate 110.

Next, FIG. 6B shows simulation results of a phosphorus ion concentration distribution in a case in which phosphorus ions are introduced into the polysilicon layer 130M having a film thickness of 100 nm, which is close to the film thickness of the gate electrode layer 130, under different conditions. In the simulation results shown in FIG. 6B, the polysilicon layer 130M (polySi), the semiconductor layer 110C (Si), and the insulating film 110B ($SiO_2$) are shown from the right in the case of facing FIG. 6B.

Further, from the conditions shown in FIG. 6B, a condition (20 keV and $1.0\times10^{16}/cm^2$) in which phosphorus ions are appropriately introduced to the central portion in the film thickness direction of the polysilicon layer 130M was selected, and a field effect transistor was manufactured using a known manufacturing method.

Figure 7A:
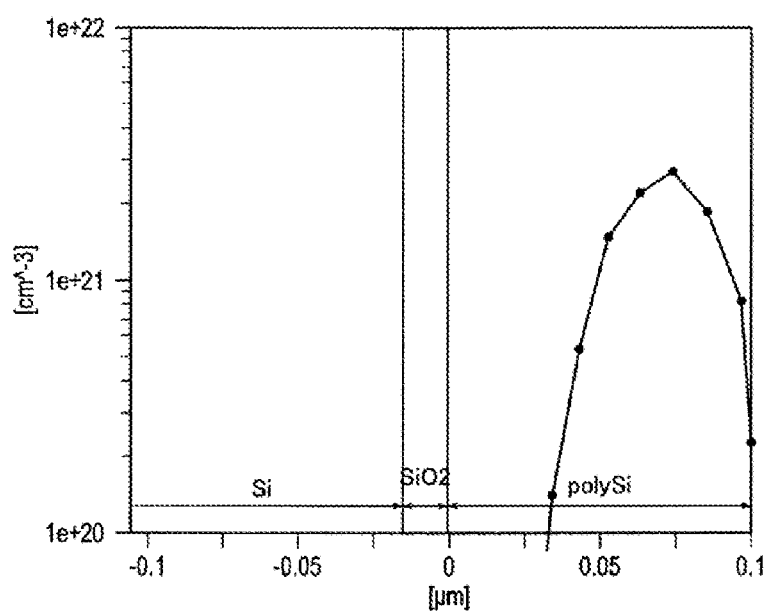
FIG. 7A is a graph showing simulation results of a phosphorus ion concentration distribution immediately after phosphorus ions are introduced into a gate electrode layer having a film thickness of 100 nm under conditions of 20 keV and $1.0\times10^{16}/cm^2$.
Figure 7B:
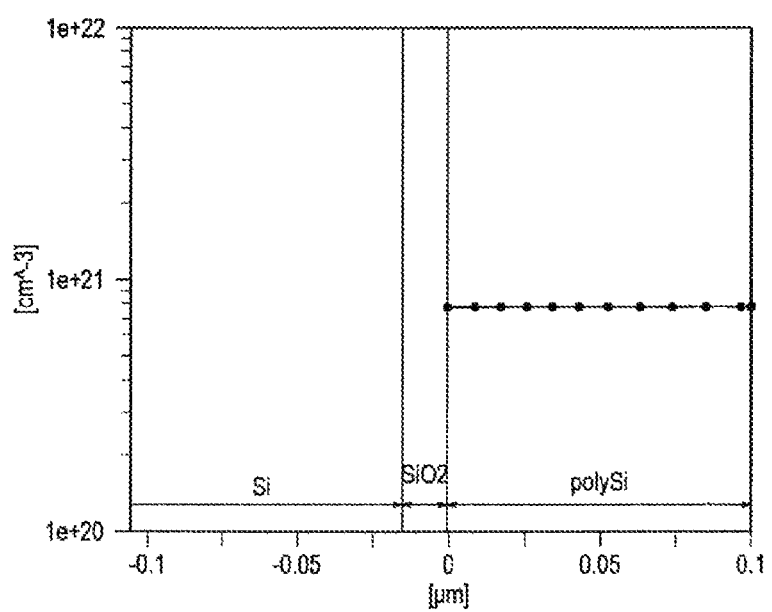
FIG. 7B is a graph showing simulation results of a phosphorus ion concentration distribution after annealing or the like is performed from the state shown in FIG. 7A.
Figure 7C:
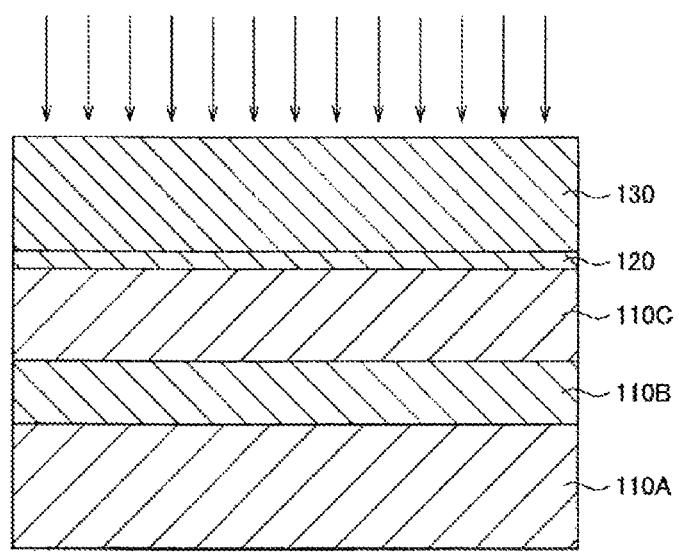
FIG. 7C is an explanatory diagram illustrating a process of introducing phosphorus ions into a gate electrode layer of a field effect transistor.
Figure 8A:
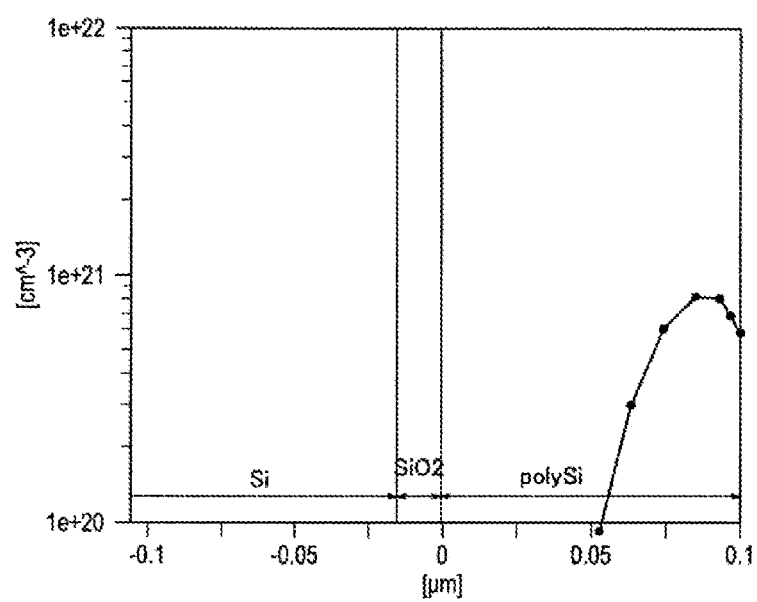
FIG. 8A is a graph showing simulation results of a phosphorus ion concentration distribution immediately after phosphorus ions are introduced into the gate electrode layer together with a process of introducing n-type impurities such as phosphorus or arsenic into a semiconductor layer to form source or drain regions.
Figure 8B:
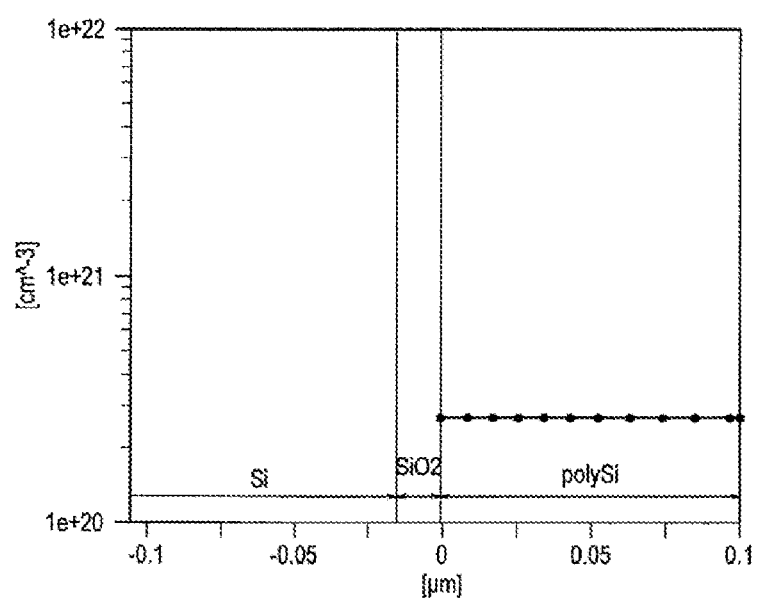
FIG. 8B is a graph showing simulation results of a phosphorus ion concentration distribution after annealing or the like is performed from the state shown in FIG. 8A.
Figure 8C:
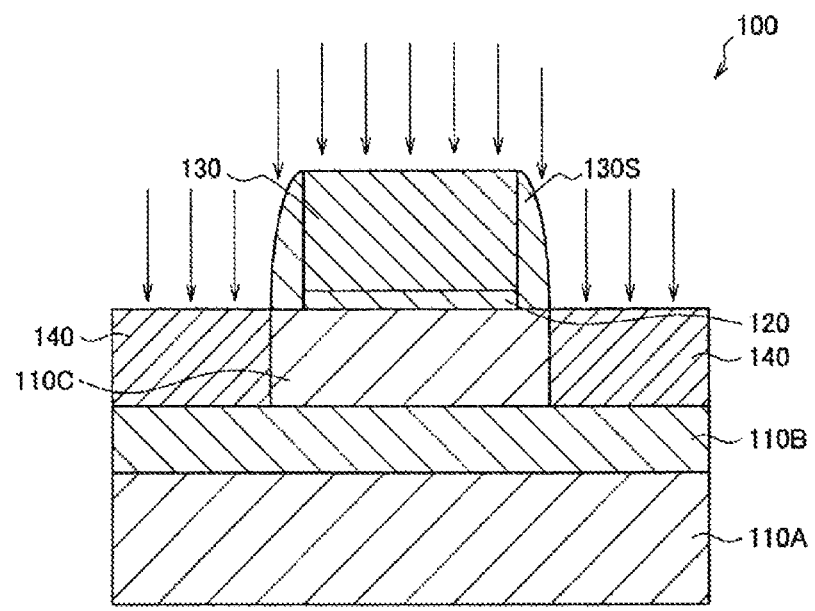
FIG. 8C shows an explanatory diagram illustrating a process of introducing phosphorus ions into a gate electrode layer of a field effect transistor according to a comparative example.

FIGS. 7A and 7B show phosphorus ion concentration distributions in the gate electrode layer 130 of the manufactured field effect transistor, and FIG. 7C shows an explanatory diagram illustrating a process of introducing phosphorus ions into the gate electrode layer 130 of the field effect transistor. Further, FIGS. 8A and 8B show phosphorus ion concentration distributions in a gate electrode layer 130 of a field effect transistor according to a comparative example, and FIG. 8C shows an explanatory diagram illustrating a process of introducing phosphorus ions into the gate electrode layer 130 of the field effect transistor according to the comparative example.

FIG. 7A is a graph showing simulation results of a phosphorus ion concentration distribution immediately after phosphorus ions are introduced into the gate electrode layer 130 having a film thickness of 100 nm under the conditions of 20 keV and $1.0\times10^{16}/cm^2$. Further, FIG. 7B is a graph showing simulation results of a phosphorus ion concentration distribution after annealing or the like has been performed from the state shown in FIG. 7A. In FIGS. 7A and 7B, the gate electrode layer 130 (polySi), the gate insulating film 120 (SiO2), and the semiconductor layer 110C (Si) are shown from the right in the case of facing FIGS. 7A and 7B.

As shown in FIGS. 7A and 7B, in the semiconductor device 100 according to the present embodiment, it can be seen that about $8.0\times10^{20}/cm^3$ phosphorus ions at a desired concentration ($6.0\times10^{20}/cm^3$) or more are introduced into the gate electrode layer 130. Further, it can be seen that the phosphorus ion concentration distribution in the gate electrode layer 130 has a peak in the film thickness direction of the gate electrode layer 130 immediately after the introduction of phosphorus ions, and the gate electrode layer 130 has no peak in the film thickness direction and becomes uniform by performing annealing or the like. As will be described later, the film stress of the gate electrode layer 130 is relaxed and reduced by performing annealing or the like, and thus the phosphorus ion concentration distribution in the gate electrode layer 130 preferably has a peak in the film thickness direction of the gate electrode layer 130.

In the present embodiment, as shown in FIG. 7C, by introducing phosphorus ions into the gate electrode layer 130 before patterning, which is uniformly deposited on the semiconductor layer 110C, the gate electrode layer 130 containing a desired concentration of phosphorus ions is formed. In this case, the semiconductor layer 110C is covered and protected by the gate electrode layer 130, and thus in the present embodiment, high-concentration phosphorus ions can be introduced into the gate electrode layer 130 without considering the damage to the semiconductor layer 110C due to the introduction of phosphorus ions.

On the other hand, FIG. 8A is a graph showing simulation results of a phosphorus ion concentration distribution immediately after phosphorus ions are introduced into the gate electrode layer 130 together with a process of introducing n-type impurities such as phosphorus or arsenic into the semiconductor layer 110C to form the source or drain regions 140. Further, FIG. 8B is a graph showing simulation results of a phosphorus ion concentration distribution after annealing or the like has been performed from the state shown in FIG. 8A. In FIGS. 8A and 8B, the gate electrode layer 130 (polySi), the gate insulating film 120 (SiO2), and the semiconductor layer 110C (Si) are shown from the right in the case of facing FIGS. 8A and 8B.

As shown in FIGS. 8A and 8B, in the field effect transistor according to the comparative example, it can be seen that about phosphorus ions of about $2.5\times10^{20}/cm^3$, which are less than the desired concentration, are introduced into the gate electrode layer 130.

In the field effect transistor according to the comparative example, as shown in FIG. 8C, phosphorus ions are introduced into the gate electrode layer 130 together with introduction of conductive impurities (that is, phosphorus) into the source or drain regions 140. For that reason, the phosphorus concentration in the gate electrode layer 130 becomes about the same as the concentration of conductive impurities in the source or drain regions 140. Therefore, in the field effect transistor according to the comparative example, it is difficult to introduce phosphorus ions into the gate electrode layer 130 at a high concentration.

For example, in the field effect transistor according to the comparative example, in a case in which introduction of phosphorus ions into the gate electrode layer 130 at a high concentration is attempted, a high concentration of phosphorus ions is introduced at the same time into the semiconductor layer 110C in which the source or drain region 140 is formed. In the source or drain regions 140 in which a higher concentration of phosphorus ions is introduced than usual, lattice defects or the like occur in the semiconductor layer 110C, and thus electrical characteristics of the field effect transistor may be deteriorated.

Therefore, in the present embodiment, introduction of the phosphorus ions into the gate electrode layer 130 and introduction of the n-type impurities into the source or drain regions 140 are performed separately. In addition, in the present embodiment, the phosphorus ions are introduced into the gate electrode layer 130 before patterning of the gate electrode layer 130, which makes it possible to introduce a desired high concentration of phosphorus ions into the gate electrode layer 130.

Figure 9:
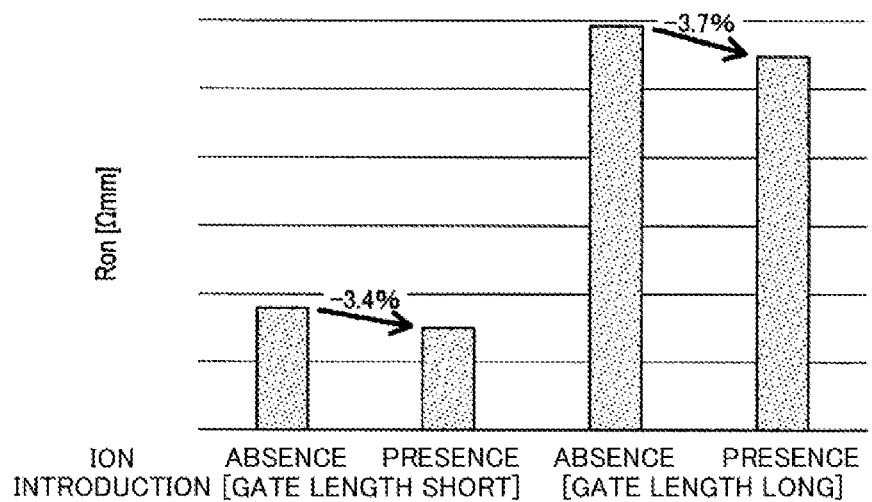
FIG. 9 is a graph in which a decrease in on-resistance due to introduction of phosphorus ions into a gate electrode layer for each of field effect transistors having different gate lengths has been verified.
Figure 10:
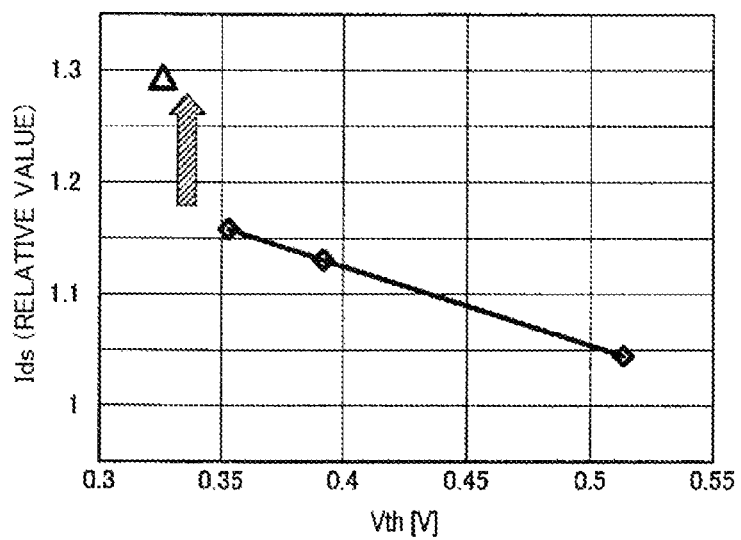
FIG. 10 is a graph in which an improvement in current capacity due to introduction of phosphorus ions into a gate electrode layer in an N-type field effect transistor.

Next, results of measuring the electrical characteristics of the semiconductor device 100 according to the present embodiment as a field effect transistor are shown in FIGS. 9 and 10. FIG. 9 is a graph in which a decrease in on-resistance due to introduction of phosphorus ions into the gate electrode layer 130 for each of field effect transistors having different gate lengths has been verified. Further, FIG. 10 is a graph in which an improvement of current capacity due to introduction of phosphorus ions into the gate electrode layer 130 in an N-type field effect transistor. The field effect transistor in which reduction in on-resistance has been verified in FIG. 9 is a switching transistor, and the field effect transistor whose current capacity has been verified in FIG. 10 is a low voltage transistor for logic circuits. It is assumed that each of the field effect transistors in FIGS. 9 and 10 is formed in the same wafer.

As shown in FIG. 9, in the semiconductor device 100 according to the present embodiment, it can be seen that the on-resistance (Ron) can be reduced to the same extent by introducing phosphorus ions into the gate electrode layer 130 regardless of a size of the gate length. Therefore, in the semiconductor device 100 according to the present embodiment, it can be seen that stress can be applied more uniformly to the channel region regardless of the size of the gate length as compared to applying stress to the channel region using a stress liner film.

Further, as shown in FIG. 10, in the semiconductor device 100 according to the present embodiment, it can be seen that the ability to pass current can be improved by deviating from a trade-off line due to adjusting impurity concentrations and the like or tolerances and the like of the channel region and the source or drain regions 140. This is considered to indicate that stress is applied to the channel region due to the introduction of phosphorus ions into the gate electrode layer 130 and the mobility of electrons serving as carriers is improved. That is, it can be seen that the semiconductor device 100 according to the present embodiment can reduce the on-resistance and improve the electrical characteristics as a field effect transistor.

Next, a relationship between the film stress applied to the gate electrode layer 130 in the semiconductor device 100 according to the present embodiment and the carrier mobility in the channel region will be described with reference to FIGS. 11 to 14C.

Figure 11:
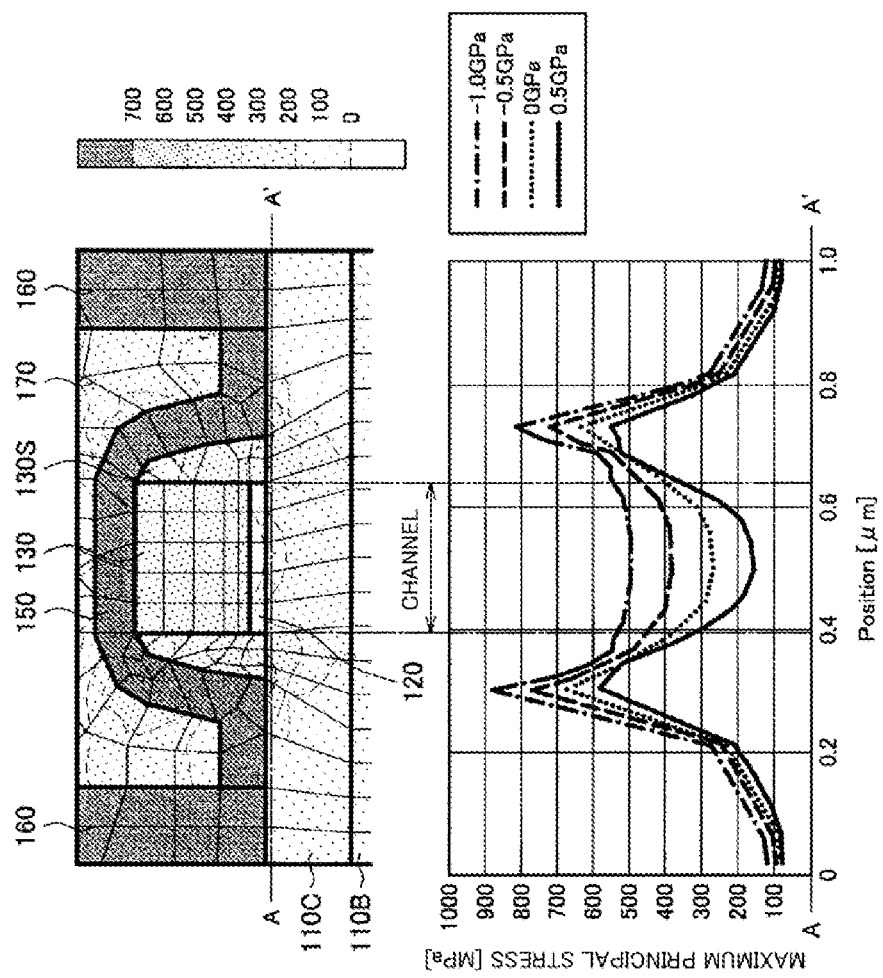
FIG. 11 is a graph showing simulation results of the maximum principal stress in a channel region of a semiconductor layer when film stress of the gate electrode layer is changed.
Figure 12A:
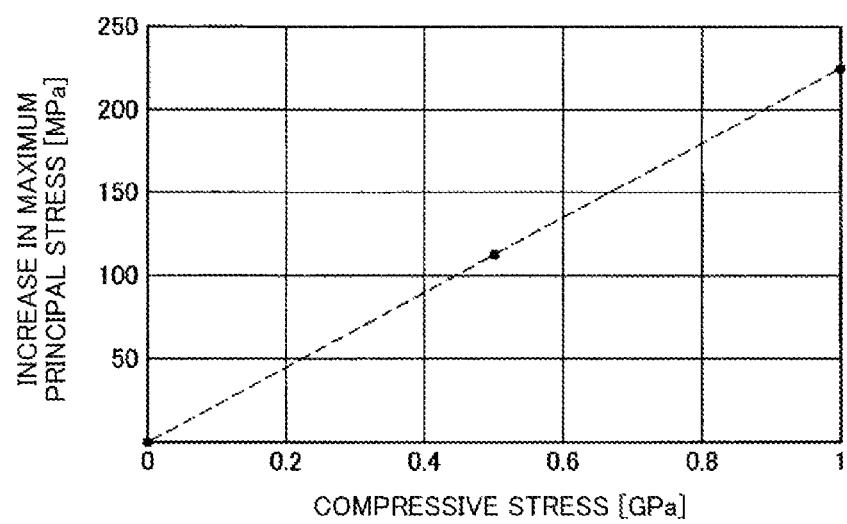
FIG. 12A is a graph showing a relationship between compressive stress applied to the gate electrode layer and an increase in principal stress on a surface of the semiconductor layer.
Figure 12B:
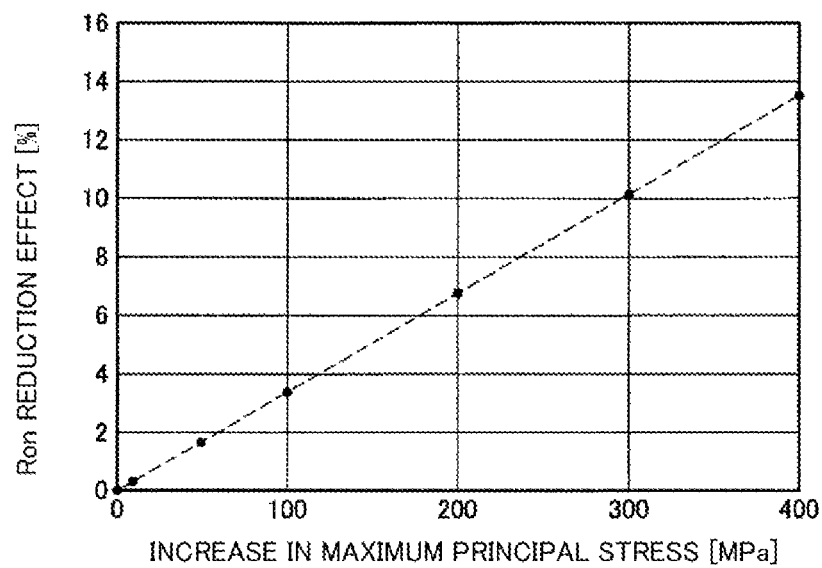
FIG. 12B is a graph showing a relationship between the increase in principal stress on the surface of the semiconductor layer and an effect of reducing an on-resistance of a field effect transistor.
Figure 12C:
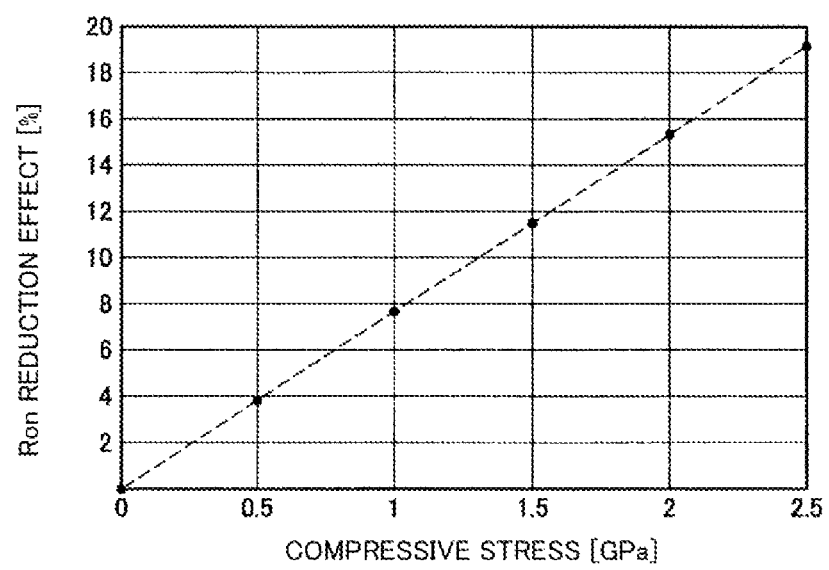
FIG. 12C is a graph showing a relationship between a magnitude of compressive stress applied to the gate electrode layer and the effect of reducing the on-resistance of the field effect transistor.

FIG. 11 is a graph showing simulation results of the maximum principal stress in the channel region of the semiconductor layer 110C when the film stress of the gate electrode layer 130 is changed. FIG. 12A is a graph showing a relationship between compressive stress applied to the gate electrode layer 130 and an increase in the principal stress on a surface of the semiconductor layer 110C. FIGS. 12B and 12C are graphs showing relationships between compressive stress applied to the gate electrode layer 130, the increase in the principal stress on the surface of the semiconductor layer 110C, and an effect of reducing the on-resistance (Ron) of the field effect transistor.

As shown in FIG. 11, stress is applied to the semiconductor layer 110C from a stress liner film 150 provided to form the contacts 160 penetrating the flattening film 170, and the gate electrode layer 130 into which phosphorus ions have been introduced. Here, it can be seen that by changing the film stress of the gate electrode layer 130, the maximum principal stress on the surface of the semiconductor layer 110C also changes. Specifically, it can be seen that the film stress of the gate electrode layer 130 is changed from tensile stress (a positive value) to compressive stress (a negative value), and a magnitude of compressive stress of the gate electrode layer 130 is further increased, whereby the maximum principal stress applied to the channel region of the semiconductor layer 110C increases.

Here, FIG. 12A shows a graph showing a relationship between the magnitude of compressive stress applied to the gate electrode layer 130 and the increase in the principal stress applied to the channel region of the semiconductor layer 110C. As shown in FIG. 12A, it can be seen that the magnitude of compressive stress applied to the gate electrode layer 130 and the increase in the principal stress applied to the channel region of the semiconductor layer 110C have a substantially linear relationship.

Further, FIG. 12B shows a graph showing a relationship between the increase in the principal stress applied to the semiconductor layer 110C and a reduction effect of the on-resistance (Ron) of the field effect transistor. As shown in FIG. 12B, it can be seen that there is a substantially linear relationship between the increase in the principal stress applied to the semiconductor layer 110C and the effect of reducing the on-resistance (Ron) of the field effect transistor. Therefore, it can be seen that the larger the compressive stress applied to the gate electrode layer 130 is, the greater the effect of reducing the on-resistance (Ron) of the field effect transistor is.

FIG. 12C shows a graph showing a relationship between the magnitude of compressive stress applied to the gate electrode layer 130 and the effect of reducing the on-resistance (Ron) of the field effect transistor. Referring to FIG. 12C, for example, in a case in which compressive stress applied to the gate electrode layer 130 is 2 MPa, it can be estimated that the effect of reducing the on-resistance (Ron) of the field effect transistor is about 15%.

Figure 13:
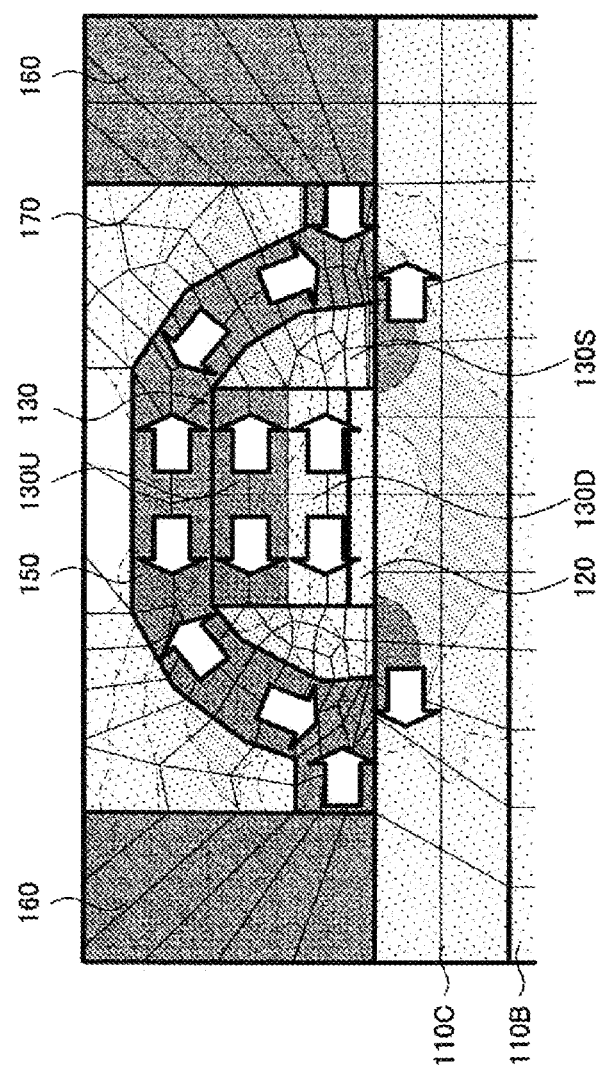
FIG. 13 is an image diagram showing results of stress simulation of a field effect transistor having a gate electrode layer formed of a plurality of layers.

Next, results of verifying how the film stress in the channel region of the semiconductor layer 110C fluctuates in accordance with a change in the film stress of each layer in a case in which the gate electrode layer 130 is formed of a plurality of layers will be described with reference to FIGS. 13 to 14C. FIG. 13 is an image diagram showing results of simulating the stress of the field effect transistor having the gate electrode layer 130 formed of a plurality of layers.

In the semiconductor device 100 shown in FIG. 13, the gate insulating film 120 is provided on the semiconductor layer 110C, and a lower gate electrode layer 130D and an upper gate electrode layer 130U are provided on the gate insulating film 120. In addition, in the semiconductor device 100, the sidewall insulating film 130S is provided on the side surfaces of the gate insulating film 120 and the gate electrode layer 130, and the stress liner film 150 is provided to cover the sidewall insulating film 130S, the lower gate electrode layer 130D, and the upper gate electrode layer 130U. Further, the semiconductor device 100 is flattened by the flattening film 170, and the contacts 160 penetrating the flattening film 170 are electrically connected to the source or drain regions 140 formed in the semiconductor layer 110C.

Figure 14A:
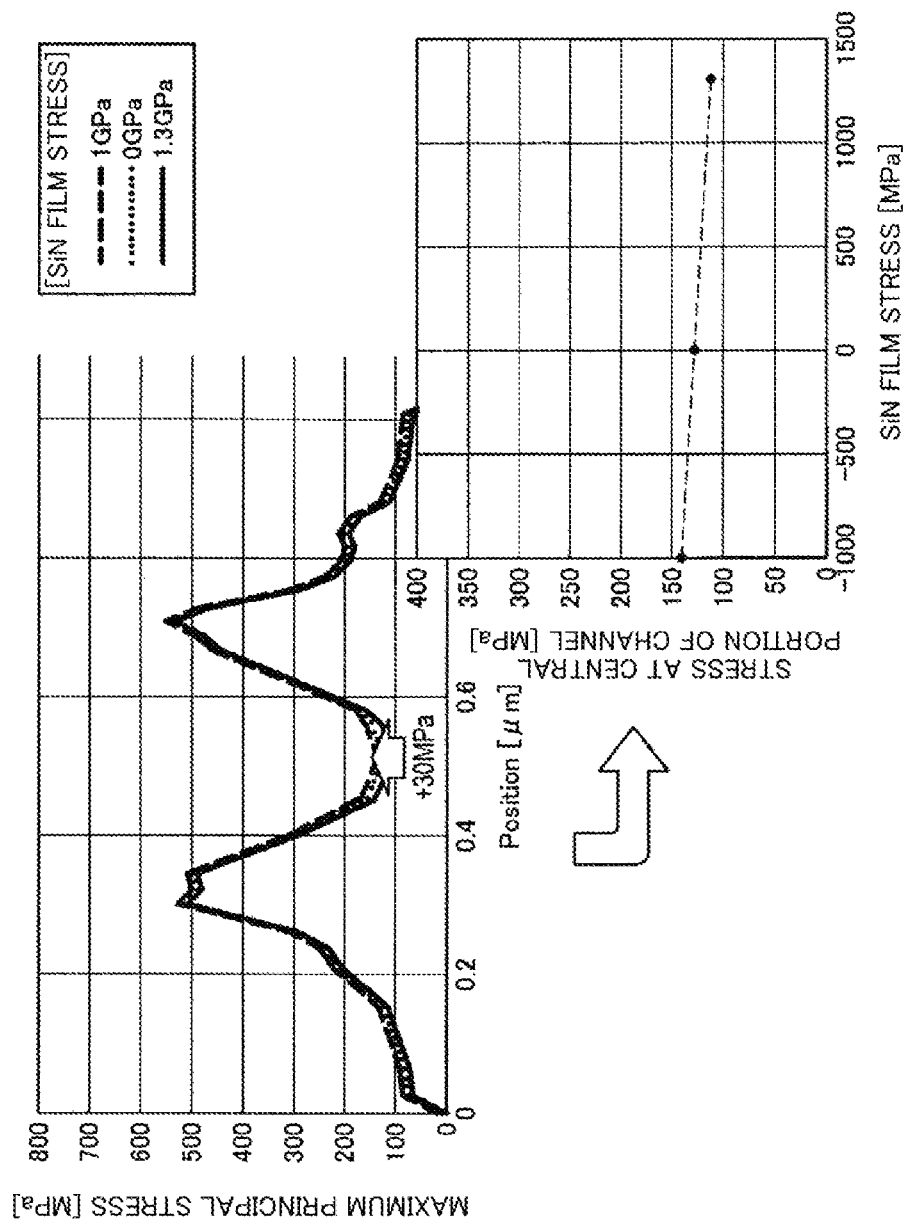
FIG. 14A is a graph showing a relationship between film stress of a stress liner film and film stress of the channel region of the semiconductor layer.
Figure 14B:
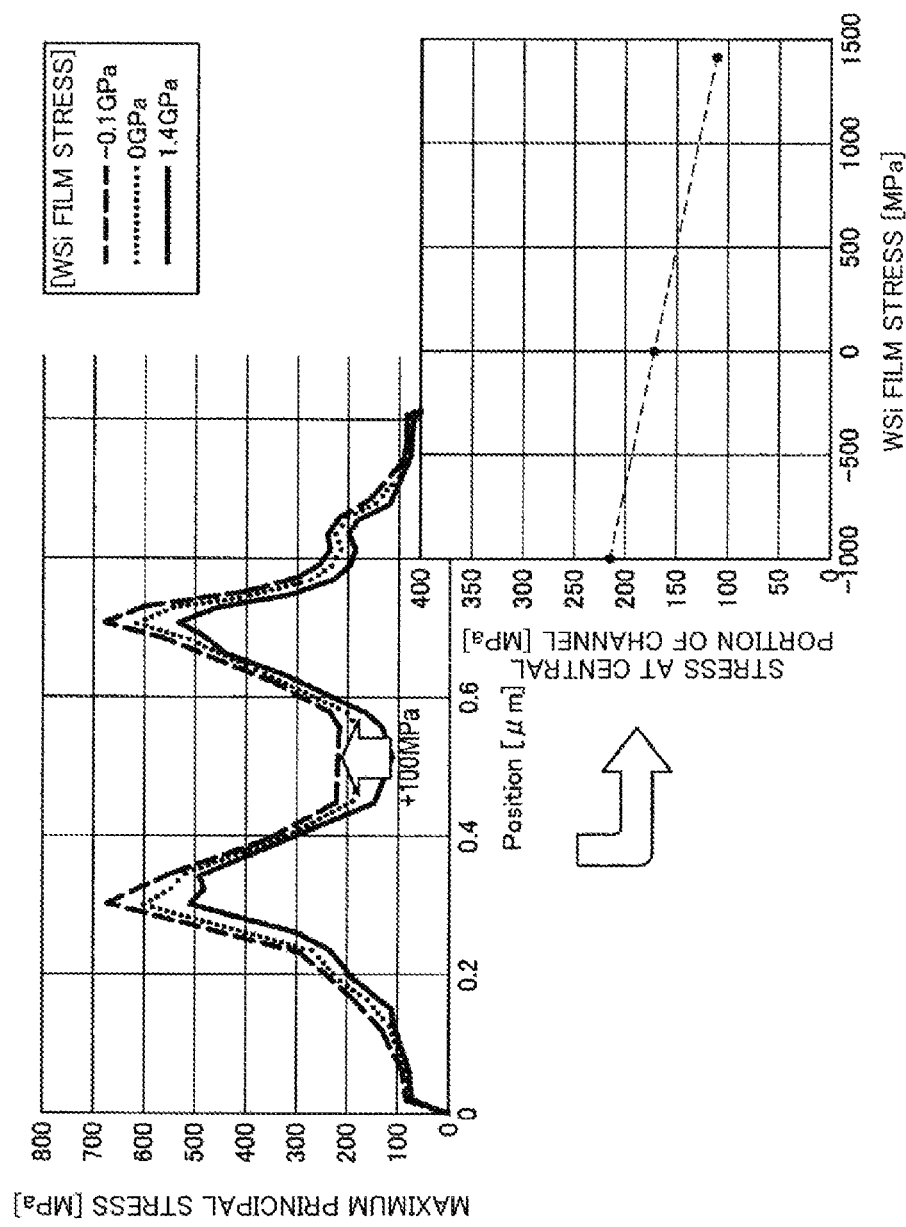
FIG. 14B is a graph showing a relationship between film stress of an upper gate electrode layer and film stress of the channel region of the semiconductor layer.
Figure 14C:
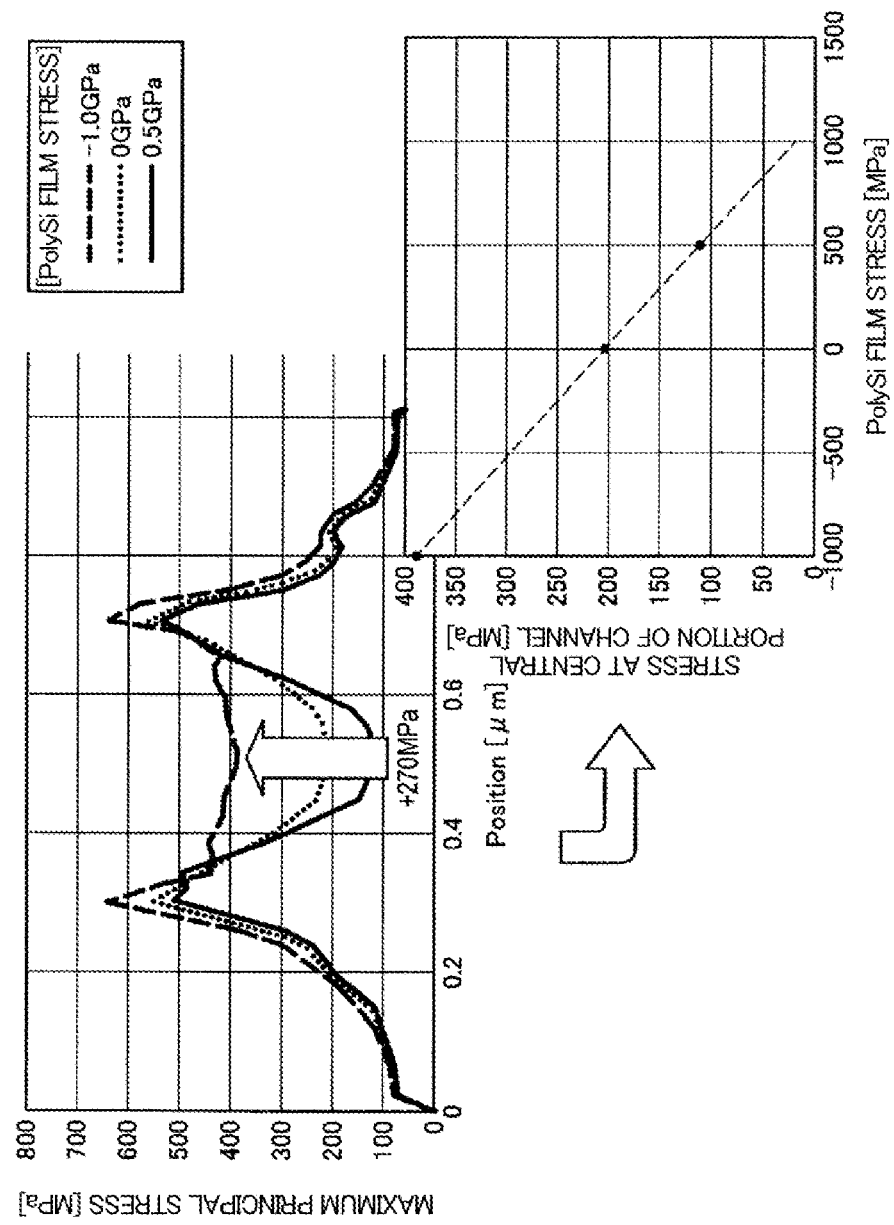
FIG. 14C is a graph showing a relationship between film stress of a lower gate electrode layer and film stress of the channel region of the semiconductor layer.

FIGS. 14A to 14C show a relationship between the film stress of each layer and the film stress of the channel region of the semiconductor layer 110C in the semiconductor device 100 in a case in which the lower gate electrode layer 130D is polysilicon with a film thickness of 100 nm, the upper gate electrode layer 130U is WSi with a film thickness of 100 nm, and the stress liner film 150 is SiN with a film thickness of 100 nm. FIG. 14A is a graph showing a relationship between the film stress of the stress liner film 150 and the film stress of the channel region of the semiconductor layer 110C, FIG. 14B is a graph showing a relationship between the film stress of the upper gate electrode layer 130U and the film stress of the channel region of the semiconductor layer 110C, and is a graph showing a relationship between the film stress of the lower gate electrode layer 130D and the film stress of the channel region of the semiconductor layer 110C.

As can be seen from the graphs shown in FIGS. 14A to 14C, the closer the layer is to the semiconductor layer 110C, the easier the film stress in the channel region of the semiconductor layer 110C is changed when the film stress is changed. Therefore, in a case in which the gate electrode layer 130 is formed of a plurality of layers, it can be seen that phosphorus ions are introduced into the layer closer to the semiconductor layer 110C to apply a large compressive stress, so that a larger tensile stress can be applied to the channel region.

3. SECOND EMBODIMENT (3.1. Configuration)

Figure 15:
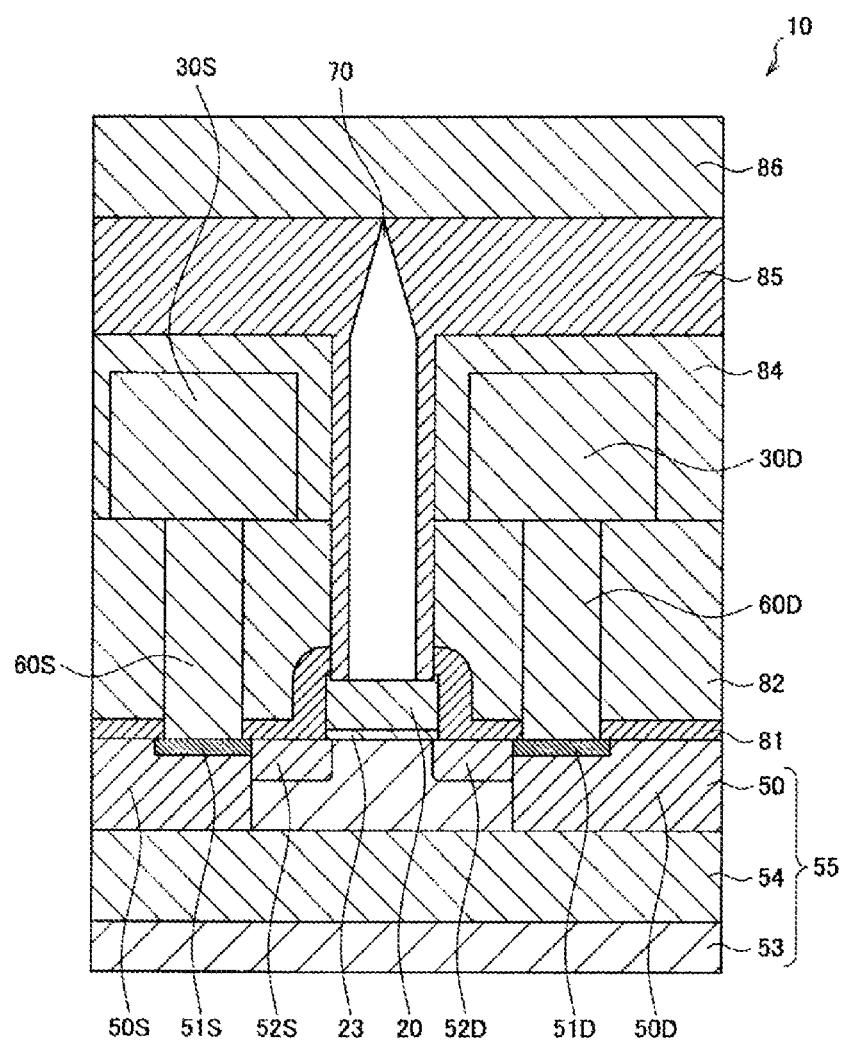
FIG. 15 is a vertical cross-sectional view illustrating a configuration of a semiconductor device according to a second embodiment of the present disclosure.
Figure 16:
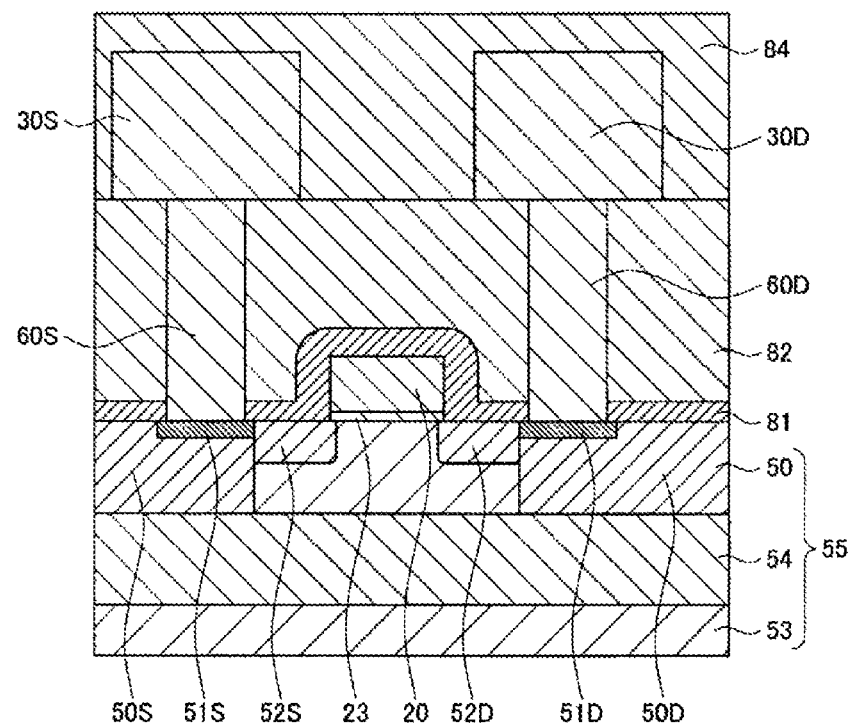
FIG. 16 is a vertical cross-sectional view showing one process of a method for manufacturing the semiconductor device according to the same embodiment.

Next, a semiconductor device according to the second embodiment of the present disclosure will be described with reference to FIG. 15. FIG. 15 is a vertical cross-sectional view illustrating a configuration of a semiconductor device 10 according to the second embodiment.

As shown in FIG. 15, the semiconductor device 10 includes a semiconductor substrate 55 in which a support substrate 53, an insulating film 54, and a semiconductor layer 50 are laminated, a gate insulating film 23, a gate electrode layer 20, source or drain regions 50S and 50D, LDD regions 52S and 52D, low resistance regions 51S and 51D, a stress liner film 81, contacts 60S and 60D, a first insulating layer 82, wiring layers 30S and 30D, a second insulating layer 84, a low dielectric constant region 70, a third insulating layer 85, and a fourth insulating layer 86.

The semiconductor substrate 55 is configured by, for example, laminating the support substrate 53, the insulating film 54, and the semiconductor layer 50. The support substrate 53 may be configured of, for example, a high resistance silicon substrate. The insulating film 54 may be made of, for example, silicon dioxide ($SiO_2$). The semiconductor layer 50 may be made of, for example, silicon (Si). That is, the semiconductor substrate 55 may be a silicon on insulator (SOI) substrate.

The source or drain regions 50S and 50D are formed as regions made of n-type silicon in the semiconductor layer 50 on both sides with the gate electrode layer 20 interposed therebetween. The low resistance regions 51S and 51D are formed on surfaces of the source or drain regions 50S and 50D as regions made of high-concentration n-type silicon or silicide for electrical connection with the contacts 60S and 60D. The LDD regions 52S and 52D are formed as regions made of low-concentration n-type silicon between the source or drain regions 50S and 50D and the gate electrode layer 20.

The gate electrode layer 20 is provided on the semiconductor layer 50 via the gate insulating film 23. Specifically, the gate insulating film 23 is made of, for example, silicon dioxide ($SiO_2$) having a film thickness of 5 nm to 10 nm. The gate electrode layer 20 is made of, for example, polysilicon having a film thickness of 80 nm to 150 nm and contains phosphorus ions at a high concentration. The contained concentration of the phosphorus ions in the gate electrode layer 20 is higher than the contained concentration of the conductive impurities in the source or drain regions 50S and 50D and is specifically $6.0 \times 10^{20}/cm^3$ or more. Thus, since compressive stress is applied to the gate electrode layer 20, the gate electrode layer 20 can apply tensile stress to the channel region of the semiconductor layer 50, thereby improving the mobility of electrons in the channel region. In addition, an upper limit of the phosphorus (P) ion concentration of the gate electrode layer 20 is not particularly limited and may be $1.0 \times 10^{23}/cm^3$ in terms of cost effectiveness, for example.

The stress liner film 81 is formed of an insulating material having an etching rate different from the first insulating layer 82. The stress liner film 81 can accurately control an etching stop position at the time of etching the first insulating layer 82 or the like by utilizing a difference in etching rate from the first insulating layer 82. Further, the stress liner film 81 can improve the carrier mobility of the channel formed on the semiconductor layer 50 by applying tensile stress to the semiconductor layer 50 below the stress liner film 81.

The first insulating layer 82 is provided on the stress liner film 81. Specifically, the first insulating layer 82 is provided on the stress liner film 81 or the semiconductor layer 50 to embed the gate electrode layer 20. For example, the first insulating layer 82 may be formed of silicon dioxide ($SiO_2$), silicon nitride (SiN) or an insulating inorganic oxynitride such as silicon oxynitride (SiON).

The contacts 60S and 60D are provided to penetrate the first insulating layer 82 and are electrically connected to the low resistance regions 51S and 51D of the source or drain regions 50S and 50D. For example, the contacts 60S and 60D may be configured of a laminated structure of titanium (Ti), titanium nitride (TiN) and tungsten (W). In addition, titanium is provided for reducing contact resistance between the contacts 60S and 60D and the low resistance regions 51S and 51D, and titanium nitride is provided as a barrier metal for inhibiting diffusion of tungsten into silicon.

The second insulating layer 84 is provided on the first insulating layer 82. For example, the second insulating layer 84 may be formed of silicon dioxide ($SiO_2$), silicon nitride (SiN) or an insulating inorganic oxynitride such as silicon oxynitride (SiON).

The wiring layers 30S and 30D are provided inside the second insulating layer 84 on the contacts 60S and 60D. The wiring layers 30S and 30D may include, for example, a source electrode and a contact electrode. The wiring layers 30S and 30D may be made of aluminum (Al) having a film thickness of 500 nm to 1,000 nm.

The low dielectric constant region 70 is a region having a dielectric constant lower than the first insulating layer 82 and the second insulating layer 84 and is provided between the contacts 60S and 60D, and between the wiring layers 30S and 30D. The low dielectric constant region 70 can improve electrical characteristics of the semiconductor device 10 by reducing a parasitic capacitance generated between the contacts 60S and 60D and between the wiring layers 30S and 30D. The low dielectric constant region 70 may be a hollow region whose inside is vacuum (relative dielectric constant is 1.0) or a hollow region in which air or the like is sealed. Alternatively, the low dielectric constant region 70 may be a region embedded with a material having a dielectric constant lower than the first insulating layer 82 and the second insulating layer 84.

Also, the low dielectric constant region 70 is provided immediately above the gate electrode layer 20 present between the source or drain regions 50S and 50D and is provided to penetrate the stress liner film 81 to expose the gate electrode layer 20. According to this, in the semiconductor device 10, impurity ions can be introduced into the gate electrode layer 20 through the low dielectric constant region 70 in a latter process of a manufacturing process of the semiconductor device 10. Accordingly, since the gate electrode layer 20 can avoid high temperature annealing for relaxing stress after the impurity ions are introduced, the applied high compressive stress can be maintained. Therefore, in the semiconductor device 10, the gate electrode layer 20 can apply higher tensile stress to the semiconductor layer 50.

The third insulating layer 85 is provided on the second insulating layer 84 to seal an upper portion of the low dielectric constant region 70. For example, the third insulating layer 85 may be formed of silicon dioxide ($SiO_2$), silicon nitride (SiN) or an insulating inorganic oxynitride such as silicon oxynitride (SiON). Further, the fourth insulating layer 86 may be provided on the third insulating layer 85 in order to more securely seal the upper portion of the low dielectric constant region 70. The fourth insulating layer 86 may be formed of silicon dioxide ($SiO_2$), silicon nitride (SiN) or an insulating inorganic oxynitride such as silicon oxynitride (SiON) similarly to the third insulating layer 85.

(3.2. Method for Manufacturing)

Next, a method for manufacturing the semiconductor device 10 according to the present embodiment will be described with reference to FIGS. 16 to 20. Hereinafter, in particular, an introduction process of impurity ions into the gate electrode layer 20 through the low dielectric constant region 70 will be explained in detail, and the other processes will be briefly explained. FIGS. 16 to 20 are vertical cross-sectional views showing a process of the method for manufacturing the semiconductor device 10 according to the present embodiment.

Specifically, first, the semiconductor substrate 55 (for example, an SOI substrate) in which the insulating film 54 and the semiconductor layer 50 are laminated on the support substrate 53 is prepared. Next, an element isolation layer (not shown) is formed in the semiconductor layer 50 by using a shallow trench isolation (STI) method to define an element region forming the semiconductor device 10. Subsequently, after an implantation protection film made of silicon dioxide is formed by a thermal oxidation method, well implantation and channel implantation are performed in the element region to remove the implantation protection film.

Next, the gate insulating film 23 made of silicon dioxide is formed with a film thickness of 5 nm to 10 nm using a thermal oxidation method. Subsequently, the gate electrode layer 20 made of polysilicon is formed with a film thickness of 80 nm to 150 nm using a chemical vapor deposition (CVD) method. Then, the gate electrode layer 20 is patterned by photolithography and etching.

Next, by implanting phosphorus (P) or arsenic (As), the LDD regions 52S and 52D and the source or drain regions 50S, 50D are sequentially formed in the semiconductor layer 50 on both sides of the gate electrode layer 20. Subsequently, the stress liner film 81 made of silicon nitride is formed on the gate electrode layer 20 and the semiconductor layer 50 with a film thickness of about 5 nm to 30 nm using a CVD method.

Next, the first insulating layer 82 made of silicon dioxide is formed on the stress liner film 81 with a film thickness of 500 nm to 1,000 nm using a CVD method. Subsequently, parts of the stress liner film 81 and the first insulating layer 82 are removed by photolithography and etching to form contact holes for exposing the source or drain regions 50S and 50D. After that, high concentration phosphorus (P) or arsenic (As) implantation is performed through the contact holes to form the low resistance regions 51S and 51D. Subsequently, the contacts 60S and 60D having laminated structures of titanium, titanium nitride, and tungsten are formed inside the contact holes.

Next, the wiring layers 30S and 30D made of aluminum (Al) are formed on the contacts 60S and 60D. Subsequently, the second insulating layer 84 made of silicon dioxide is formed on the first insulating layer 82 and the wiring layers 30S and 30D using a CVD method. As a result, the laminated structure shown in FIG. 16 can be formed.

Figure 17:
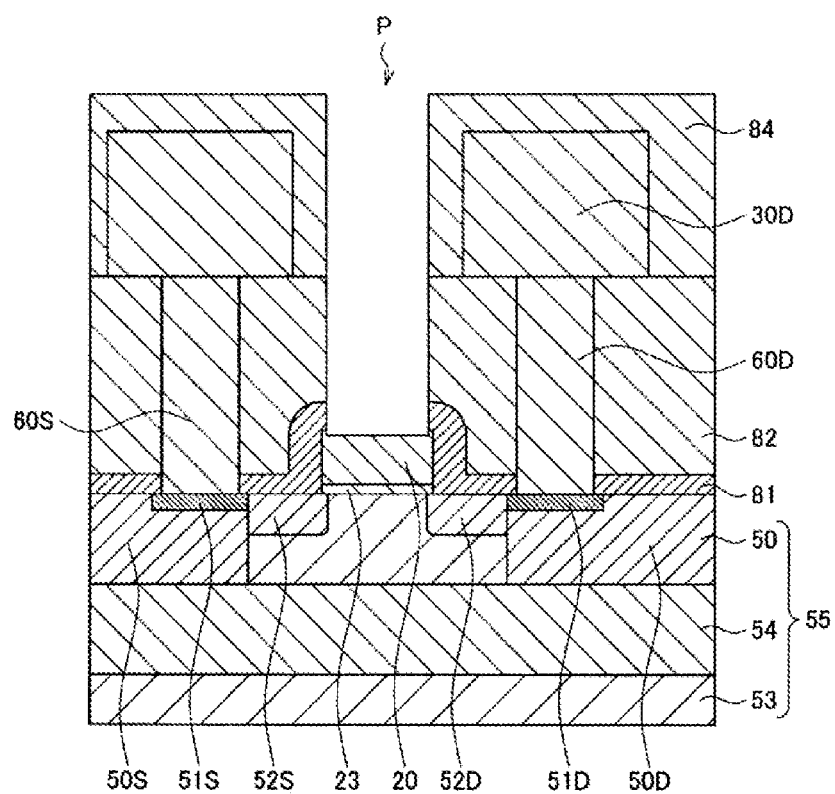
FIG. 17 is a vertical cross-sectional view showing one process of the method for manufacturing the semiconductor device according to the same embodiment.

Subsequently, as shown in FIG. 17, using vertical anisotropic etching such as dry etching, etching of about 1.0 μm to 2.0 μm is performed to penetrate the first insulating layer 82 and the second insulating layer 84 until the gate electrode layer 20 is exposed, thereby forming an opening P. For example, in a case in which a distance between the source electrode and the drain electrode of the wiring layers 30S and 30D is 0.5 μm, a width of the opening P is set to be about 0.3 μm and may be the same as a width of the gate electrode layer 20.

Figure 18:
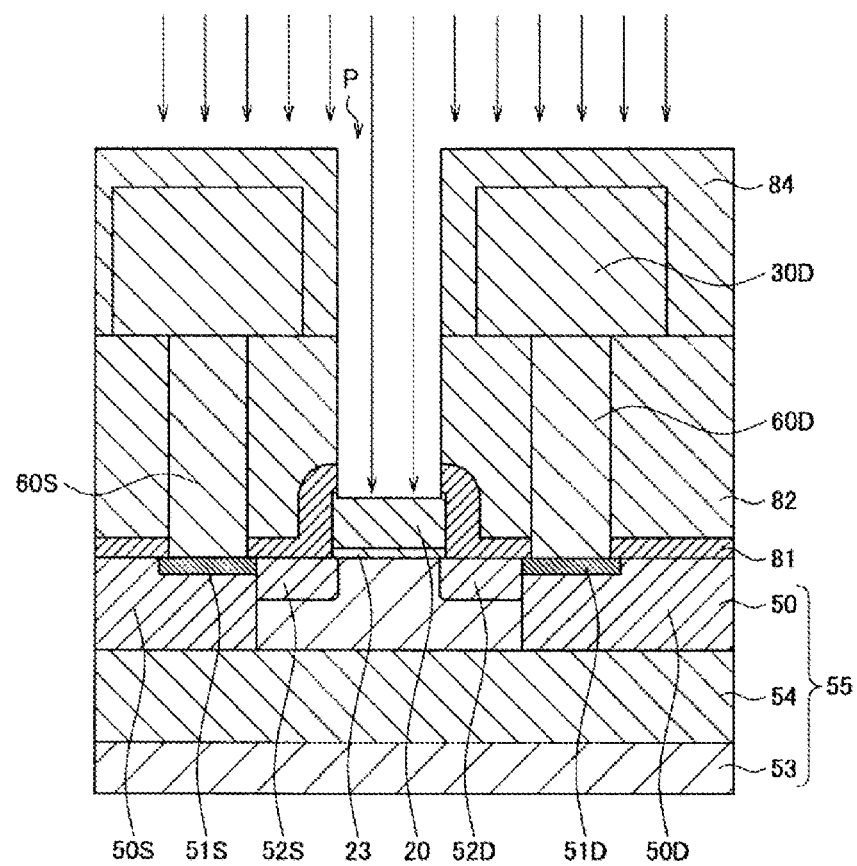
FIG. 18 is a vertical cross-sectional view showing one process of the method for manufacturing the semiconductor device according to the same embodiment.

Therefore, as shown in FIG. 18, using the opening P, phosphorus ions are introduced vertically into the gate electrode layer 20 at 20 keV and $1.0 \times 10^{16}/cm^2$ (in a case in which the film thickness of the gate electrode layer 20 is 100 nm), so that the phosphorus ions can be introduced to the vicinity of a central portion of the gate electrode layer 20. In this case, since the phosphorus ions are also introduced into the first insulating layer 82 and the second insulating layer 84 exposed by the opening P, the first insulating layer 82 and the second insulating layer 84 adjacent to the opening P contain the same impurity ions (phosphorus ions) as the gate electrode layer 20.

In addition, the etching of the opening P may not penetrate the stress liner film 81 and may be performed to the extent that the stress liner film 81 is exposed. Even in such a case, the phosphorus ions can be introduced into the gate electrode layer 20 through the stress liner film 81. Also, the stress liner film 81 on the gate electrode layer 20 in this case contains the same impurity ions (phosphorus ions) as the gate electrode layer 20.

Figure 19:
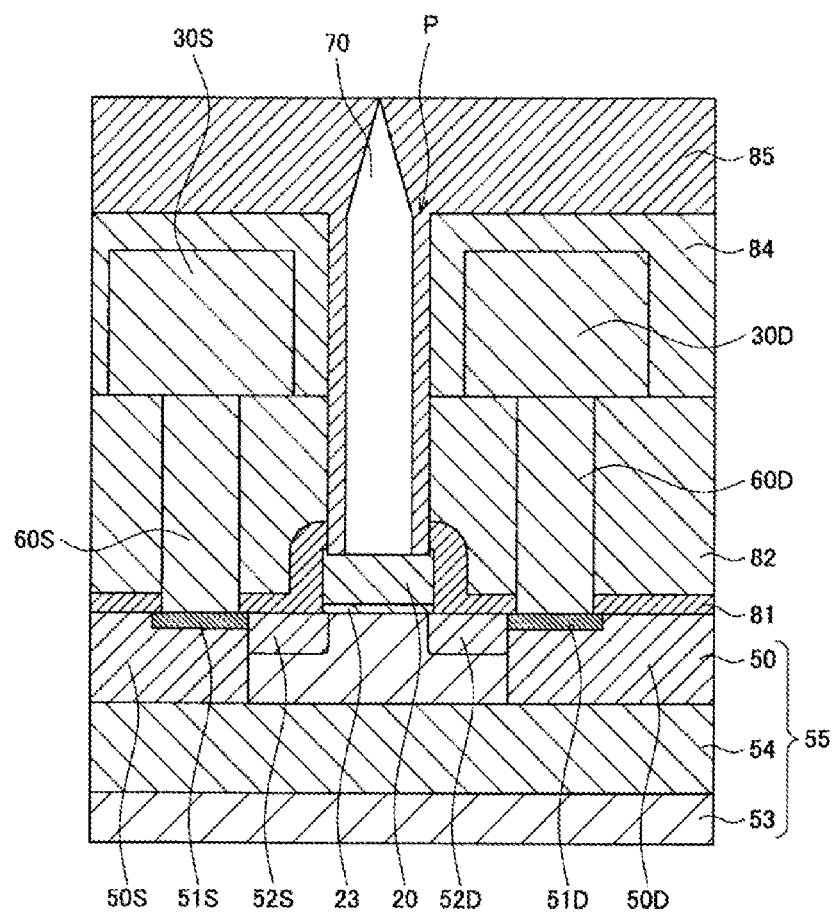
FIG. 19 is a vertical cross-sectional view showing one process of the method for manufacturing the semiconductor device according to the same embodiment.
Figure 20:
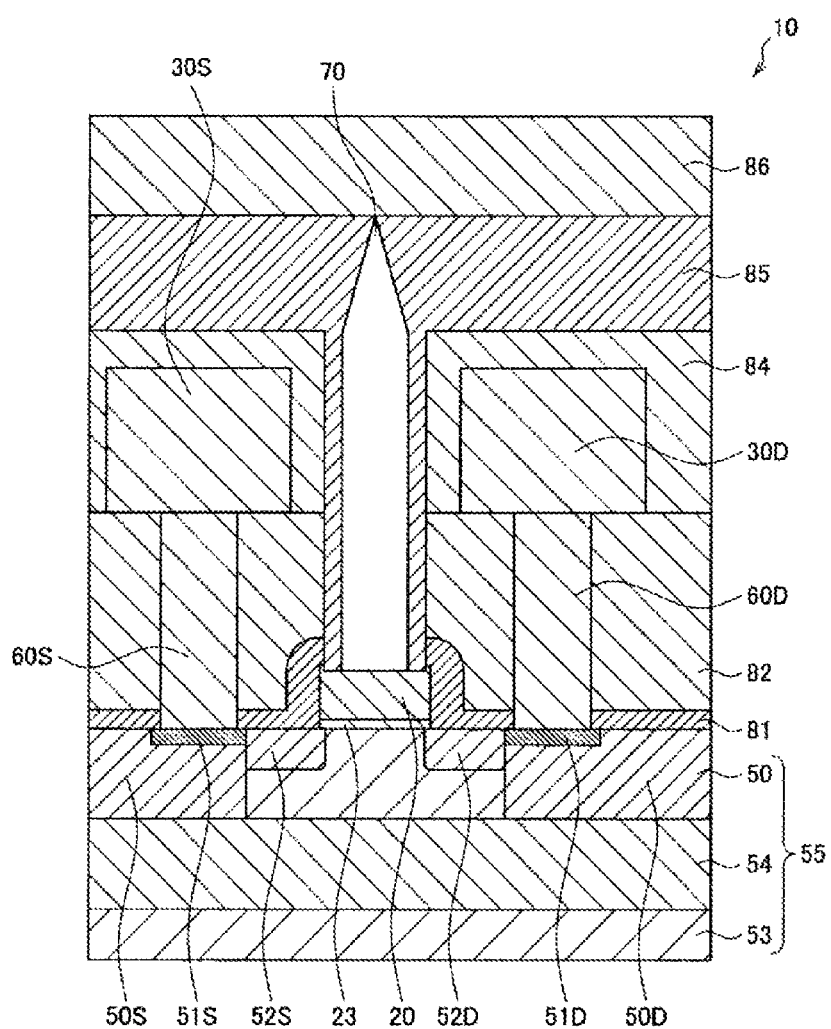
FIG. 20 is a vertical cross-sectional view showing one process of the method for manufacturing the semiconductor device according to the same embodiment.

Subsequently, as shown in FIGS. 19 and 20, the third insulating layer 85 is formed on the second insulating layer 84, and the fourth insulating layer 86 is formed on the third insulating layer 85, thereby sealing the opening P and forming the low dielectric constant region 70. For example, a plasma SiO (P-SiO) film of 0.2 μm to 0.5 μm is deposited as the third insulating layer 85, and a plasma tetra ethoxysilane (P-TEOS) film of 1.0 μm to 2.0 μm is deposited as the fourth insulating layer 86, whereby the opening P can be sealed by utilizing incomplete coverage of the deposition.

According to the method for manufacturing the semiconductor device 10, since the phosphorus ions can be introduced into the gate electrode layer 20 in a state in which the semiconductor layer 50 is not exposed, phosphorus ions with a high concentration can be introduced into the gate electrode layer 20 without generating crystal defects in the semiconductor layer 50. The magnitude of compressive stress applied to the gate electrode layer 20 depends on the concentration of the phosphorus ions introduced into the gate electrode layer 20, and thus according to this, the phosphorus ions with a high concentration can be introduced by the gate electrode layer 20.

Also, according to the method for manufacturing the semiconductor device 10, the impurity ions can be introduced into the gate electrode layer 20 after the entire high temperature annealing process at 800° C. or higher performed when the field effect transistor is formed. As a result, since the gate electrode layer 20 can avoid stress relaxation due to the high temperature annealing process, for example, a large compressive stress of about 2,000 MPa immediately after the ion introduction can be maintained. Therefore, according to the method for manufacturing the semiconductor device 10, since a larger tensile stress can be applied to the channel region of the semiconductor layer 50, the carrier mobility can be further improved.

Also, since the concentration distribution of the impurity ions in the gate electrode layer 20 in this case has not been subjected to the high temperature annealing process, the distribution having a peak in the film thickness direction of the gate electrode layer 20 is obtained as mentioned above in FIG. 7A. In addition, a width of the low dielectric constant region 70 (that is, the opening P) used for introducing the impurity ions into the gate electrode layer 20 is limited by a width between the source electrode and the drain electrode. For that reason, in a case in which the impurity ions are introduced into the gate electrode layer 20 through the low dielectric constant region 70 (that is, the opening P), the impurity ions may be introduced only into a partial region including the central portion of the gate electrode layer 20 in a gate length direction, and thus the impurity ions may not be introduced into both end portions thereof in the gate length direction. Even in such a case, the gate electrode layer 20 can apply sufficient tensile stress to the channel region of the semiconductor layer 50. Further, since the concentration distribution of the impurity ions in the gate electrode layer 20 in this case has not been subjected to the high temperature annealing process, the distribution having a peak in the gate length direction of the gate electrode layer 20 is obtained.

4. APPLICATION EXAMPLES

The semiconductor device according to one embodiment of the present disclosure can be applied to any device on which field effect transistors are mounted. For example, the semiconductor device according to one embodiment of the present disclosure can be applied to complementary metal oxide semiconductor (CMOS) circuits, a variety of display devices, CMOS or CCD image sensors, semiconductor memory devices, radio frequency (RF) switches for wireless communication, power amplifiers, low noise amplifiers, etc.

Although the preferred embodiments of the present disclosure have been described in detail with reference to the accompanying figures as described above, the technical scope of the present disclosure is not limited to such examples. It is clear that a person having ordinary knowledge in the technical field of the present disclosure could conceive various modified examples or changes within the scope of the technical ideas set forth in the claims, which should also be understood to be within the technical scope of the present disclosure.

Also, the effects described in the present specification are merely explanatory or exemplary and are not intended as limiting. That is, the techniques according to the present disclosure may achieve other effects apparent to those skilled in the art from the description of the present specification, in addition to or in place of the above effects.

Further, the following configurations also belong to the technical scope of the present disclosure.

(1)

A semiconductor device including:
a semiconductor substrate;
a gate insulating film provided on the semiconductor substrate;
a gate electrode layer that is provided on the gate insulating film and contains impurity ions; and
source or drain regions that are provided on the semiconductor substrate on both sides of the gate electrode layer and contain conductive impurities, wherein a concentration of the impurity ions in the gate electrode layer is higher than a concentration of the conductive impurities in the source or drain regions.

(2)

The semiconductor device according to the above (1), wherein a concentration of the impurity ions in at least a partial region of the gate electrode layer is $6.0 \times 10^{20}/\text{cm}^3$ or more.

(3)

The semiconductor device according to the above (1) or (2), wherein the impurity ions are phosphorus ions.

(4)

The semiconductor device according to any one of the above (1) to (3), wherein the conductive impurities are n-type impurities.

(5)

The semiconductor device according to any one of the above (1) to (4), wherein the gate electrode layer is formed of polysilicon.

(6)

The semiconductor device according to any one of the above (1) to (5), wherein the semiconductor substrate is an SOI substrate in which an insulating film is sandwiched therein.

(7)

A semiconductor device including:
a semiconductor substrate;
a gate insulating film provided on the semiconductor substrate;
a gate electrode layer that is provided on the gate insulating film and contains impurity ions;
source or drain regions that are provided on the semiconductor substrate on both sides of the gate electrode layer and contain conductive impurities;
a first insulating layer provided on the semiconductor substrate;

contacts that penetrate the first insulating layer and are provided respectively on the source or drain regions;
a second insulating layer provided on the first insulating layer;
wiring layers provided on the second insulating layer above the respective contacts; and
low dielectric constant regions that are provided in the first insulating layer and the second insulating layer at respective locations between the contacts and the wiring layers and have dielectric constants lower than the first insulating layer and the second insulating layer, wherein
the first insulating layer and the second insulating layer on surface sides provided with the low dielectric constant regions contain the impurity ions.

(8)
The semiconductor device according to the above (7), wherein a concentration distribution of the impurity ions in the gate electrode layer has a peak in a thickness direction of the gate electrode layer.

(9)
The semiconductor device according to the above (7) or (8), wherein a concentration of the impurity ions in a center of the gate electrode layer in a gate length direction is higher than a concentration of the impurity ions at both ends thereof in the gate length direction.

(10)
The semiconductor device according to any one of the above (7) to (9), wherein the low dielectric constant regions are provided adjacent to the gate electrode layer.

(11)
The semiconductor device according to any one of the above (7) to (9), further comprising a stress liner film that is formed of an insulating material having an etching rate different from the first insulating layer and the second insulating layer and is provided on the gate electrode layer, wherein the stress liner film contains the impurity ions.

(12)
The semiconductor device according to the above (7) to (11), wherein the low dielectric constant regions are hollow regions.

(13)
The semiconductor device according to the above (7) to (12), wherein upper portions of the low dielectric constant regions are sealed by a third insulating layer provided on the second insulating layer.

(14)
The semiconductor device according to the above (7) to (13), wherein the impurity ions are phosphorus ions.

(15)
The semiconductor device according to the above (7) to (14), wherein the conductive impurities are n-type impurities.

(16)
The semiconductor device according to the above (7) to (15), wherein the gate electrode layer is formed of polysilicon.

(17)
The semiconductor device according to the above (7) to (16), wherein the semiconductor substrate is an SOI substrate in which an insulating film is interposed.

(18)
A method for manufacturing a semiconductor device including:
forming a gate insulating film uniformly on a semiconductor substrate;
forming a gate electrode layer uniformly on the gate insulating film;
introducing impurity ions into the gate electrode layer;
patterning the gate insulating film and the gate electrode layer; and
introducing conductive impurities into the semiconductor substrates on both sides of the gate insulating film and the gate electrode layer to form source or drain regions in the semiconductor substrates, wherein
a concentration of the impurity ions introduced into the gate electrode layer is higher than a concentration of the conductive impurities introduced into the source or drain regions.

(19)
A method for manufacturing a semiconductor device including:
forming a gate insulating film uniformly on a semiconductor substrate;
forming a gate electrode layer uniformly on the gate insulating film;
patterning the gate insulating film and the gate electrode layer;
introducing conductive impurities into the semiconductor substrate on both sides of the gate insulating film and the gate electrode layer to form source or drain regions in the semiconductor substrate;
forming a first insulating layer on the semiconductor substrate;
forming contacts penetrating the first insulating layer respectively on the source or drain regions;
forming wiring layers on the respective contacts and forming a second insulating layer on the first insulating layer;
forming openings for exposing the gate electrode layer in the first insulating layer and the second insulating layer between the contacts and the wiring layers;
introducing impurity ions into the first insulating layer, the second insulating layer, and the gate electrode layer that are adjacent to the openings; and
forming a third insulating layer that seals the openings on the second insulating layer.

REFERENCE SIGNS LIST

10 Semiconductor devices
20 Gate electrode layer
23 Gate insulating film
30S, 30D Wiring layer
50 Semiconductor layer
50S, 50D Source or drain region
51S, 51D Low resistance region
52S, 52D LDD region
53 Support substrate
54 Insulating film
55 Semiconductor substrate
60S, 60D Contact
70 Low dielectric constant region
81 Stress liner film
82 First insulating layer
84 Second insulating layer
85 Third insulating layer
86 Fourth insulating layer
100 Semiconductor device
110 Semiconductor substrate
110A Support substrate
110B Insulating film
110C Semiconductor layer 120 Gate insulating film
130 Gate electrode layer
130S Sidewall insulating film
140 Source or drain region
150 Stress liner film
160 Contact
170 Flattening film

What is claimed is:

1. A semiconductor device comprising:
a semiconductor substrate in which a support substrate, an insulating film, and a semiconductor layer are laminated;
a gate insulating film provided on the semiconductor substrate;
a sidewall insulating film;
a gate electrode layer that is provided on the gate insulating film and contains impurity ions, wherein the gate electrode layer is formed in a multilayer structure, wherein at least one layer of the multilayer structure is formed of a polysilicon layer including phosphorus ions, and wherein the polysilicon layer is formed closest to the semiconductor layer; and
source or drain regions that are provided in the semiconductor substrate on both sides of the gate electrode layer and contain conductive impurities, wherein a concentration of the impurity ions in the gate electrode layer is higher than a concentration of the conductive impurities in the source or drain regions.

2. The semiconductor device according to claim 1, wherein a concentration of the impurity ions in the polysilicon layer is $6.0 \times 10^{20}/cm^3$ or more.

3. The semiconductor device according to claim 1, wherein the conductive impurities are n-type impurities.

4. The semiconductor device according to claim 1, wherein the gate electrode layer is formed of polysilicon.

5. A method for manufacturing a semiconductor device comprising:
forming a gate insulating film uniformly on a semiconductor substrate in which a support substrate, an insulating film, and a semiconductor layer are laminated;
forming a sidewall insulating film;
forming a gate electrode layer uniformly on the gate insulating film, wherein the gate electrode layer is formed in a multilayer structure, wherein at least one layer of the multilayer structure is formed of a polysilicon layer including phosphorus ions, and wherein the polysilicon layer is formed closest to the semiconductor layer;
introducing impurity ions into the gate electrode layer;
patterning the gate insulating film and the gate electrode layer; and
introducing conductive impurities into the semiconductor substrate on both sides of the gate insulating film and the gate electrode layer to form source or drain regions in the semiconductor substrate, wherein a concentration of the impurity ions introduced into the gate electrode layer is higher than a concentration of the conductive impurities introduced into the source or drain regions.

* * * * *